(12) United States Patent
Yang et al.

(10) Patent No.: US 12,423,251 B2
(45) Date of Patent: Sep. 23, 2025

(54) MEMORY DEVICE, METHOD FOR CONTROLLING MEMORY DEVICE AND MEMORY SYSTEM

(71) Applicant: YANGTZE MEMORY TECHNOLOGIES CO., LTD., Wuhan (CN)

(72) Inventors: Xin Yang, Wuhan (CN); Zhuqin Duan, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

(21) Appl. No.: 18/089,515

(22) Filed: Dec. 27, 2022

(65) Prior Publication Data
US 2023/0244615 A1 Aug. 3, 2023

Related U.S. Application Data

(63) Continuation of application No. PCT/CN2022/074800, filed on Jan. 28, 2022.

(51) Int. Cl.
*G06F 13/00* (2006.01)
*G06F 9/448* (2018.01)
(Continued)

(52) U.S. Cl.
CPC ........ *G06F 13/1668* (2013.01); *G06F 9/4498* (2018.02); *G06F 13/1642* (2013.01);
(Continued)

(58) Field of Classification Search
None
See application file for complete search history.

(56) References Cited

U.S. PATENT DOCUMENTS 5,471,638 A 11/1995 Keeley
9,335,939 B2 * 5/2016 Bennett ................. G06F 3/0689
(Continued)

FOREIGN PATENT DOCUMENTS

CN 104126178 A 10/2014
CN 106575259 A 4/2017
(Continued)

OTHER PUBLICATIONS

Extended European Search Report issued in corresponding European Application No. 22 82 1836, dated Oct. 10, 2023, 12 pages.
(Continued)

*Primary Examiner* — Midys Rojas
(74) *Attorney, Agent, or Firm* — BAYES PLLC

(57) ABSTRACT

A memory device, a method for controlling the memory device, and a memory system are provided. The memory device includes a memory array comprising a plurality of memory planes, and a peripheral circuit configured to control the plurality of memory planes to perform asynchronous operations. The peripheral circuit comprises a plurality of state machines connected to a memory interface of the memory device. Each state machine is configured to associated with one or more assigned memory planes of the plurality of memory planes. Each state machine is further configure to receive, from the memory interface in parallel with other state machines, a corresponding sequence of control commands of the one or more assigned memory planes; and independently process the corresponding sequence of control commands to obtain control information of the one or more assigned memory planes.

20 Claims, 23 Drawing Sheets

(51) Int. Cl.
*G06F 13/16* (2006.01)
*G06F 3/06* (2006.01)

(52) U.S. Cl.
CPC ............ *G06F 3/064* (2013.01); *G06F 3/0659* (2013.01); *G06F 13/1689* (2013.01); *G06F 13/1694* (2013.01)

(56) References Cited

U.S. PATENT DOCUMENTS

| | | | |
|---|---|---|---|
| 2005/0041493 | A1 | 2/2005 | Maeda |
| 2007/0260925 | A1 | 11/2007 | Do |
| 2008/0137461 | A1 | 6/2008 | Pyeon et al. |
| 2013/0173844 | A1 | 7/2013 | Chen et al. |
| 2016/0048343 | A1 | 2/2016 | Pekny et al. |
| 2017/0123726 | A1 | 5/2017 | Sinclair et al. |
| 2020/0293452 | A1* | 9/2020 | Lee ........................ G06F 9/3836 |
| 2021/0373993 | A1 | 12/2021 | Sharon et al. |
| 2022/0238145 | A1* | 7/2022 | Rao ...................... G11C 7/1078 |

FOREIGN PATENT DOCUMENTS

| | | |
|---|---|---|
| CN | 109684230 A | 4/2019 |
| CN | 110383232 A | 10/2019 |
| CN | 112513988 A | 3/2021 |
| CN | 113056790 A | 6/2021 |
| CN | 113228181 A | 8/2021 |
| CN | 113892139 A | 1/2022 |
| JP | 2015500541 A | 1/2015 |
| JP | 2015503798 A | 2/2015 |
| JP | 2017527897 A | 9/2017 |
| JP | 2018525737 A | 9/2018 |
| JP | 2022522444 A | 4/2022 |
| KR | 20040104286 A | 12/2004 |
| KR | 20140119701 A | 10/2014 |
| KR | 20170041885 A | 4/2017 |
| WO | 2013/101573 A1 | 7/2013 |
| WO | 2016/025173 A1 | 2/2016 |

OTHER PUBLICATIONS

Anonymous: "Finite-state machine-Wikipedia", Sep. 28, 2015 (Sep. 28, 2015), XP0551531, Retrieved from the Internet: URL:https://en.wikipedia.org/w/index.php?title=Finite-state_machine&oldid=683228594 [retrieved Nov. 29, 2023].

Communication pursuant to Article 94(3) EPC issued in corresponding European Application No. 22821836.8, mailed Jun. 5, 2025, 10 pages.

Anonymous: "DDR5 SDRAM Wikipedia", Dec. 6, 2021 (Dec. 6, 2021), pp. 1-7, XP093282130, Retrieved from the Internet: URL:https://en.wikipedia.org/w/index.php? title !: DDR5_SDRAM&oldid= 1058855576, 10 pages.

Anonymous: "Multi-channel memory architecture—Wikipedia", Oct. 19, 2021 (Oct. 19, 2021), pp. 1-8, XP093282129, Retrieved from the Internet: URL:https://en.wikipedia.org/w/index.php?title:eMultichannel_ memory architecture&oldid == 1050786630, 8 pages.

\* cited by examiner

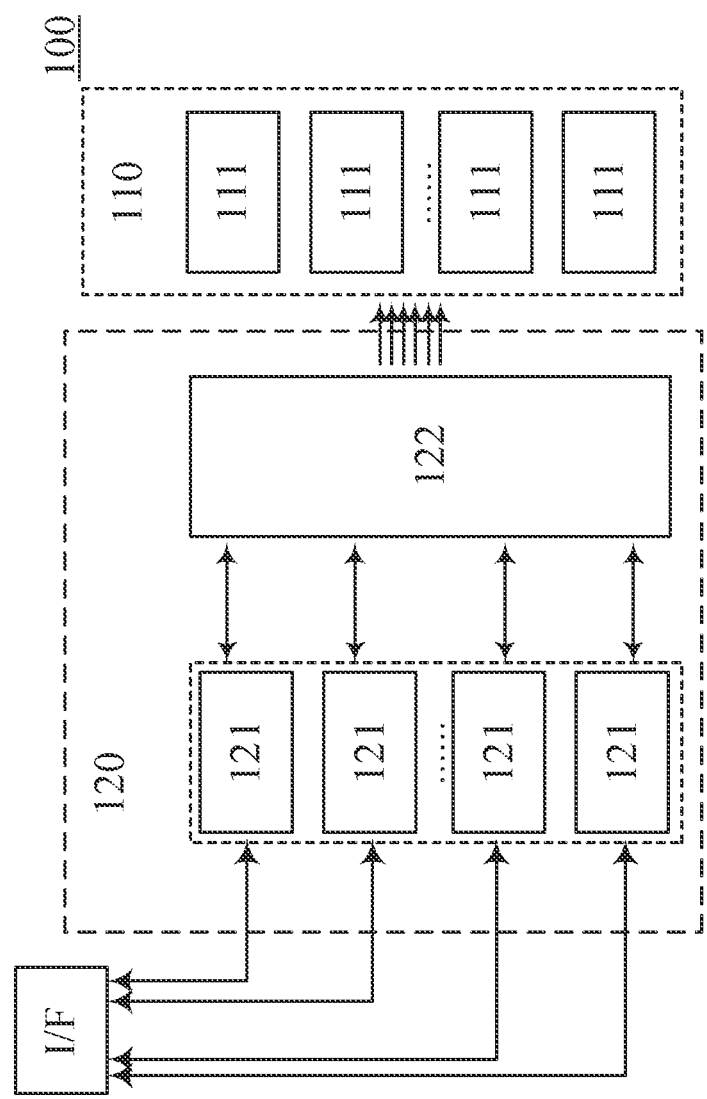

FIG. 9

MEMORY DEVICE, METHOD FOR CONTROLLING MEMORY DEVICE AND MEMORY SYSTEM

CROSS-REFERENCE TO RELATED APPLICATION

This application is a continuation of International Application No. PCT/CN2022/074800, filed on Jan. 28, 2022, the entire content of which is incorporated by reference in its entirety.

TECHNICAL FIELD

Implementations of the present disclosure relate to a memory device, a method for controlling a memory device and a memory system.

BACKGROUND

Semiconductor memory devices have been widely applied in various electronic devices. For example, non-volatile semiconductor memory devices are applied in cellular phones, digital cameras, personal digital assistants, mobile computing devices, non-mobile computing devices, and various other electronic devices. With the development of information technology, the amount of data used by these devices also increases rapidly, which promotes larger flash memory storage capacities and faster speeds of the memory devices. In order to meet the market demand, NAND flash memory technology is developing rapidly, and NAND flash memory chips are often packaged with multiple NAND dies at a package level, to increase capacities of the NAND flash memory chips. In addition, an AMPI (Async Multi-plane Independent) read operation is proposed to realize independent read control of different memory planes.

However, in order to avoid conflict of resources for processing control commands, control commands for different memory planes need to be processed serially, which results in a slow overall processing rate and redundant waiting time, thus making the access efficiency of the whole memory device low.

SUMMARY

Implementations of the present disclosure provide a memory device, a method for controlling a memory device, and a memory system.

In a first aspect, the implementations of the present disclosure provide a memory device, which includes a memory array and a peripheral circuit. The memory array includes memory planes, each of the memory planes including memory blocks comprising memory cells. The peripheral circuit is connected to the memory array and configured to be able to control the memory planes to perform asynchronous operations. Herein, the peripheral circuit includes at least one state machine (STM). Each of the at least one state machine is disposed to correspond to at least one of the memory planes. Each of the at least one state machine is connected to a memory interface and capable of receiving control commands associated with asynchronous operations of a corresponding memory plane of the memory planes from the memory interface in parallel, and each of the at least one state machine is capable of independently processing the received control commands to obtain control information for the corresponding memory plane.

In a second aspect, the implementations of the present disclosure further provide a method for controlling a memory device, the method is executed by a peripheral circuit in the memory device, the peripheral circuit includes at least one state machine; the method includes the following operations. At least one state machine in the memory device receives control commands associated with asynchronous operations for memory planes in the memory device in parallel, wherein each of the state machines is disposed to be corresponding to at least one of the memory planes; and each of the state machines processed the received control commands independently, and obtaining control information of a corresponding one of the memory planes.

In a third aspect, the implementations of the present disclosure further provide a memory system, which includes any one of the above memory devices, and a controller connected to the memory device, the controller is configured to send control commands to the memory device through a memory interface of the memory device.

BRIEF DESCRIPTION OF THE DRAWINGS

FIG. 2A is a schematic structural diagram of a memory device according to an implementation of the present disclosure.

FIG. 9 is a timing diagram of a method for controlling a memory device in an implementation.

DETAILED DESCRIPTION

For ease of understanding of the present disclosure, a detailed description is given below with reference to the accompanying drawings. The present disclosure may be implemented in many different forms and is not limited to the implementations described herein. implementation Unless otherwise defined, all technical and scientific terms used herein have the same meanings as those commonly understood by those skilled in the art. Terms used herein in the specification of the present disclosure are for the purpose of describing implementations and are not intended to limit the present disclosure. The term "and/or" as used herein includes any and all combinations of one or more related listed items.

Figure 1A:
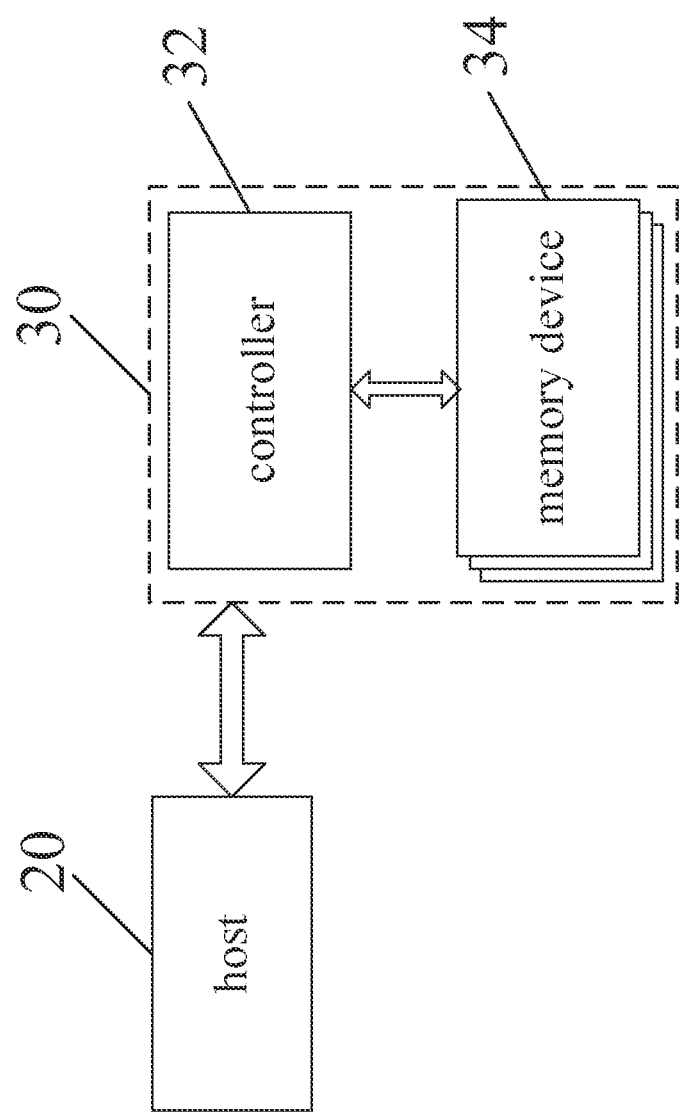
FIG. 1A is a schematic structural diagram of a system according to an implementation of the present disclosure.

As shown in FIG. 1A, an implementation of the present disclosure illustrates an exemplary system 10 which may include a host 20 and a memory system 30. Herein, the exemplary system 10 may include, but is not limited to, a mobile phone, a desktop computer, a laptop computer, a tablet computer, a vehicle computer, a game console, a printer, a positioning device, a wearable electronic device, a smart sensor, a virtual reality (VR) device, an augmented reality (AR) device, or any other suitable electronic device having a memory device 34 therein. The host 20 may be a processor of an electronic device (e.g., a central processing unit (CPU)) or a system-on-chip (SoC) (e.g., an application processor (AP)).

In implementations of the present disclosure, the host 20 may be configured to send data to or receive data from the memory system 30. Here, the memory system 30 may include a controller 32 and at least one memory device 34. The memory device 34 may include, but is not limited to, a NAND Flash Memory, a Vertical NAND Flash Memory, a NOR Flash Memory, a Dynamic Random Access Memory (DRAM), a Ferroelectric Random Access Memory (FRAM), a Magnetoresistive Random Access Memory (MRAM), a Phase Change Random Access Memory (PCRAM), a Resistive Random Access Memory (RRAM), a Nano Random Access Memory (NRAM), and etc.

On the other hand, the controller 32 may be coupled to the memories 34 and the host 20, and be configured to control the memory device 34. As an example, the controller may be designed to operate in a low-duty cycle environment, such as a Secure Digital (SD) card, a Compact Flash (CF) card, a Universal Serial Bus (USB) flash drive, or other media for use in an electronic device such as a personal computer, a digital camera, a mobile phone, etc. In some implementations, the controller may also be designed to operate in a high-duty cycle environment SSD or an embedded multimedia card (eMMC) that serves as a data store for mobile devices such as smartphones, tablet computers, laptops, and an enterprise storage array. Further, the controller may manage data in the memory device and communicate with the host. The controller may be configured to control operations such as memory reading, erasing, and programming; may further be configured to manage various functions with respect to data stored or to be stored in the memory device including but not limited to bad block management, garbage collection, logical-to-physical address translation, wear leveling and the like; and may further be configured to process error correction codes (ECC) with respect to data read from or written to the memory device. In addition, the controller may perform any other suitable function such as formatting the memory device or communicating with an external device (e.g., the host 20 in FIG. 1A) according to a particular communication protocol. By way of example, The controller may communicate with the external device through at least one of a variety of interface protocols, such as USB protocol, MMC protocol, Peripheral Component Interconnection (PCI) protocol, PCI High Speed (PCI-E) protocol, Advanced Technology Accessories (ATA) protocol, Serial ATA protocol, Parallel ATA protocol, Small Computer Small Interface (SCSI) protocol, Enhanced Small Disk Interface (ESDI) protocol, Integrated Drive Electronics (IDE) protocol, Firewire protocol, and the like.

Figure 1C:
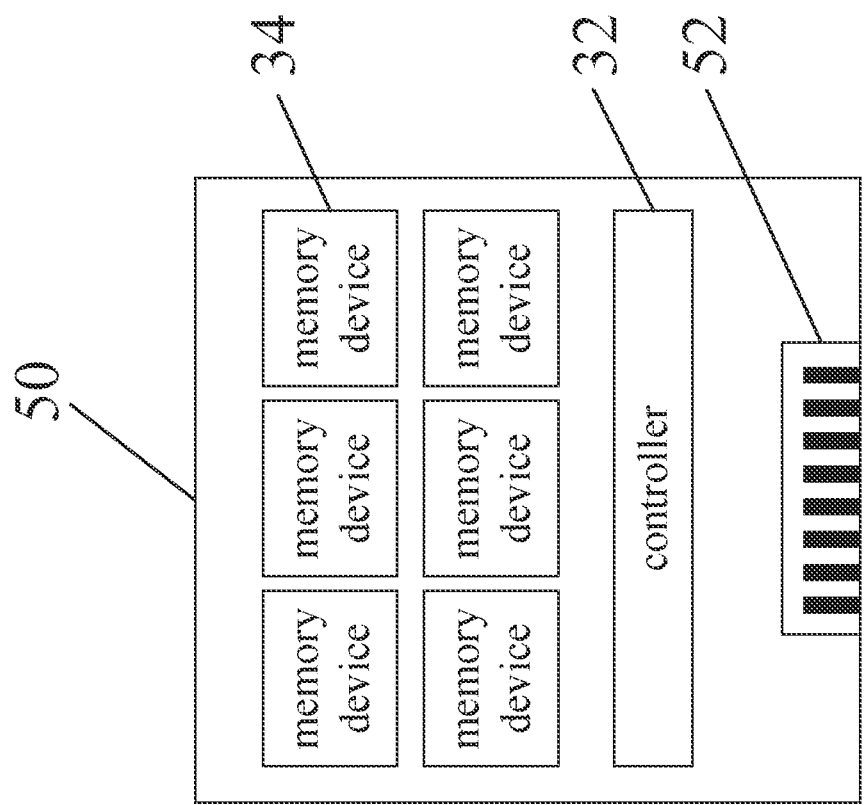
FIG. 1C is a structural schematic diagram of a solid-state drive according to the implementation of the present disclosure.
Figure 1B:
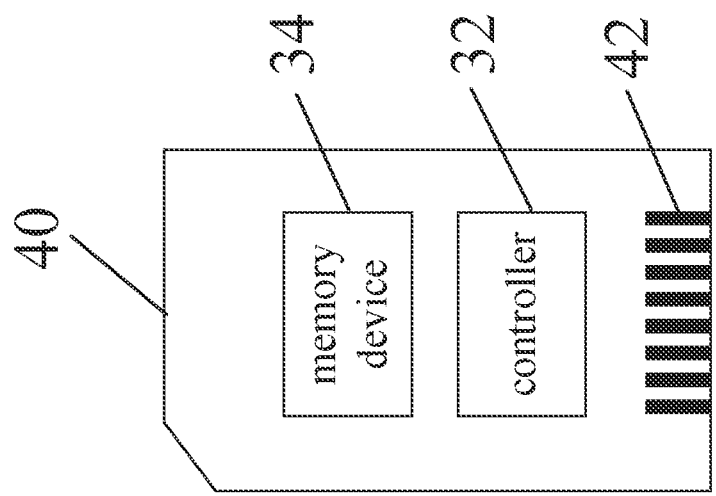
FIG. 1B is a schematic structural diagram of a memory card according to the implementation of the present disclosure.

In the implementations of the present disclosure, the controller and the at least one memory device may be integrated into various types of memory devices, for example, included in the same package (for example, a general-purpose flash storage (UFS) package or an eMMC package). That is, the memory system can be implemented and packaged into different types of terminal electronic products. As shown in FIG. 1B, the controller 32 and a single memory device 34 may be integrated into a memory card 40. The memory card 40 may include a PC card (PCMCIA, Personal Computer Memory Card International Association), a CF card, a Smart Media (SM) card, a memory stick, a multimedia card (MMC, RS-MMC, MMCmicro), an SD card (SD, miniSD, microSD, SDHC), a UFS, and the like. The memory card 40 may also include a memory card connector 42 that couples the memory card 40 to a host (e.g., the host 20 in FIG. 1A). In another implementation as shown in FIG. 1C, the controller 32 and a plurality of memories 34 may be integrated into the SSD 50. The SSD 50 may further include an SSD connector 52 that couples the SSD 50 to a host (e.g., the host 20 in FIG. 1A). In some implementations, a storage capacity and/or operating speed of the SSD 50 is greater than a storage capacity and/or operating speed of the memory card 40.

Figure 1D:
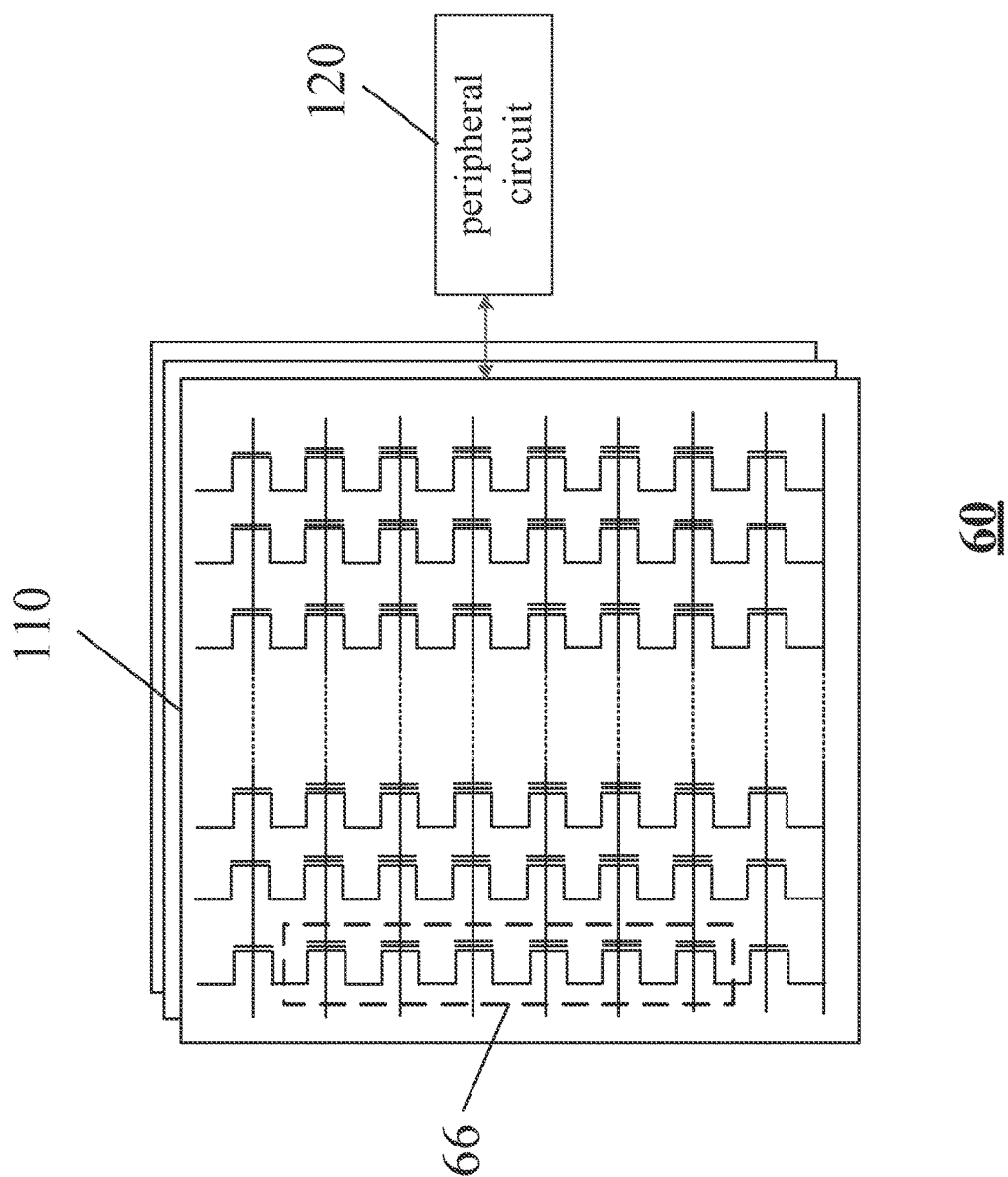
FIGS. 1D and 1E are schematic structural diagrams of a memory device including a memory cell array and a peripheral circuit according to an implementation of the present disclosure.

It should be noted that the memory device according to the implementation of the present disclosure may be a semiconductor memory device, which is a solid-state electronic device for storing data information produced in a semiconductor integrated circuit process. FIG. 1D is a diagram of an exemplary memory device 60 in an implementation of the present disclosure. The memory device 60 may be the memory device 34 in FIGS. 1A to 1C. As shown in FIG. 1D, the memory 60 may comprise a memory array 110, a peripheral circuit 120 coupled to the memory array 110, and the like. Here, the memory array 110 may be a NAND flash memory cell array, in which memory cells are provided in a form of an array of NAND memory strings 66, each NAND memory string extending vertically over a substrate (not shown). In some implementations, each NAND memory string 66 may include a plurality of memory cells coupled in series and stacked vertically. Herein, each memory cell maintains a continuous analog value such as a voltage or a charge, which depends on a number of electrons trapped within a memory cell region. In addition, each memory cell in the above-described memory array 110 may be a floating-gate-type memory cell including a floating-gate transistor or a charge-trapping-type memory cell including a charge-trapping transistor.

In an implementation of the present disclosure, the above-mentioned memory cell may be a Single Level Cell (SLC) having two possible memory states and thus being able to store one bit of data. For example, a first memory state "0" may correspond to a first voltage range, and a second memory state "1" may correspond to a second voltage range. In other implementations, each memory cell is a Multi-Level Cell (MLC) capable of storing more than a single bit of data in more than four memory states. For example, an MLC can store two bits per cell, three bits per cell (also known as Triple Level Cell (TLC)), or four bits per cell (also known as Quad Level Cell (QLC)). Each MLC can be programmed to take a range of possible nominal stored values. As an example, if each MLC stores two bits of data, the MLC may be programmed to take one of three possible programming levels from the erase state by writing one of three possible nominal storage values to the memory cell. Herein, the fourth nominal stored value may be used as the erase state.

Figure 1E:
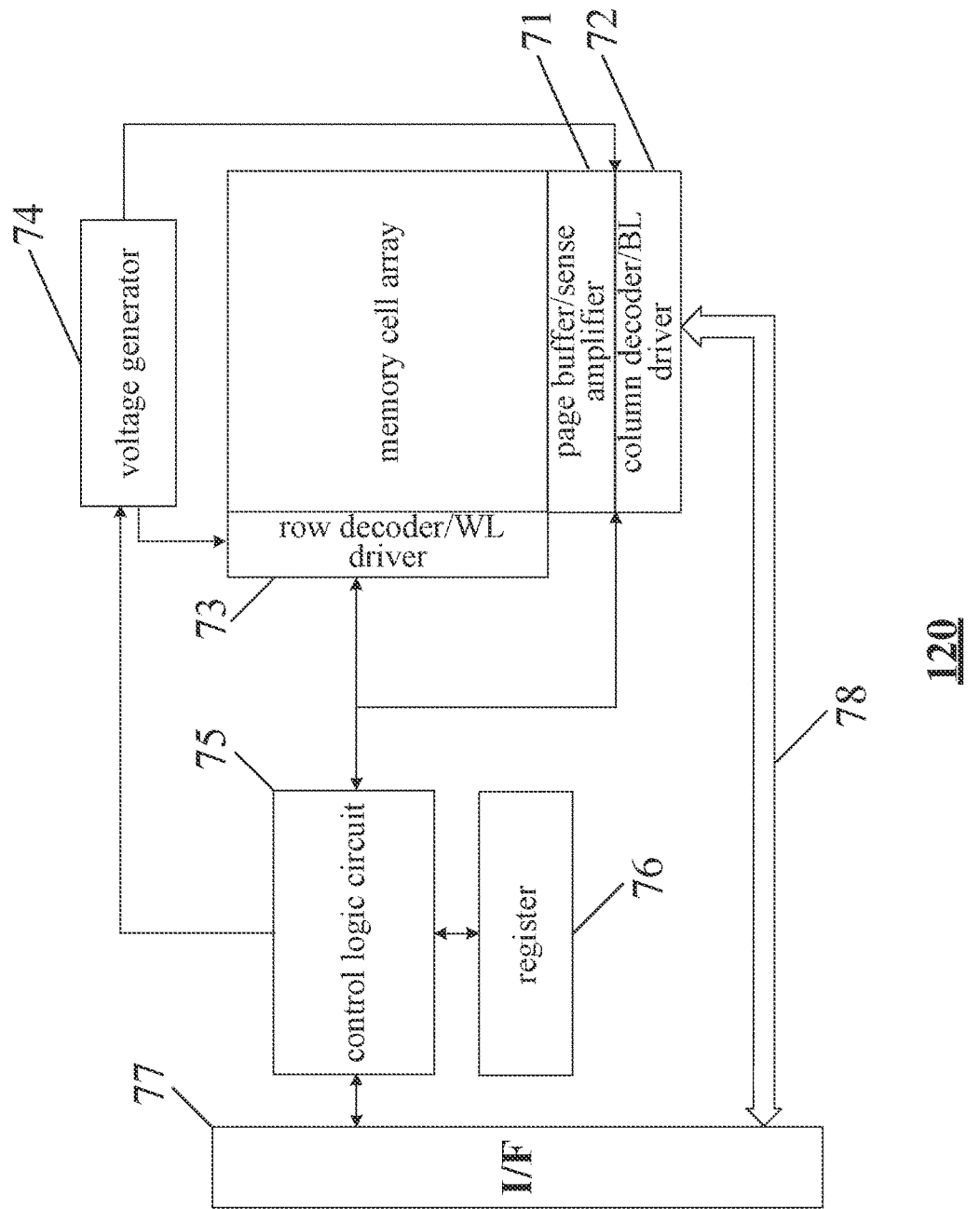

In implementations of the present disclosure, the above-described peripheral circuit 120 may be coupled to the memory cell array through bit lines (BLs), word lines (WLs), source lines, source select gates (SSGs), and drain select gates (DSGs). Here, the peripheral circuit may include any suitable analog, digital, and mixed-signal circuits for facilitating operations of the memory cell array by applying voltage signals and/or current signals to each target memory cell and sensing voltage signals and/or current signals from each target memory cell via bit lines, word lines, sources, SSGs, and DSGs. In addition. the peripheral circuit 120 may further include various types of peripheral circuits formed using the metal-oxide-semiconductor (MOS) technology. As illustrated in FIG. 1E, the peripheral circuit 120 includes a page buffer/sense amplifier 71, a column decoder/bit line driver 72, a row decoder/word line driver 73, a voltage generator 74, a control logic circuit 75, a register 76, an interface 77, and a data bus 78. It should be understood that the peripheral circuit 120 described above may be the same as the peripheral circuit 120 in FIG. 1D. In other implementations, the peripheral circuit 120 may further include an additional peripheral circuit not shown in FIG. 1E.

Figure 1F:
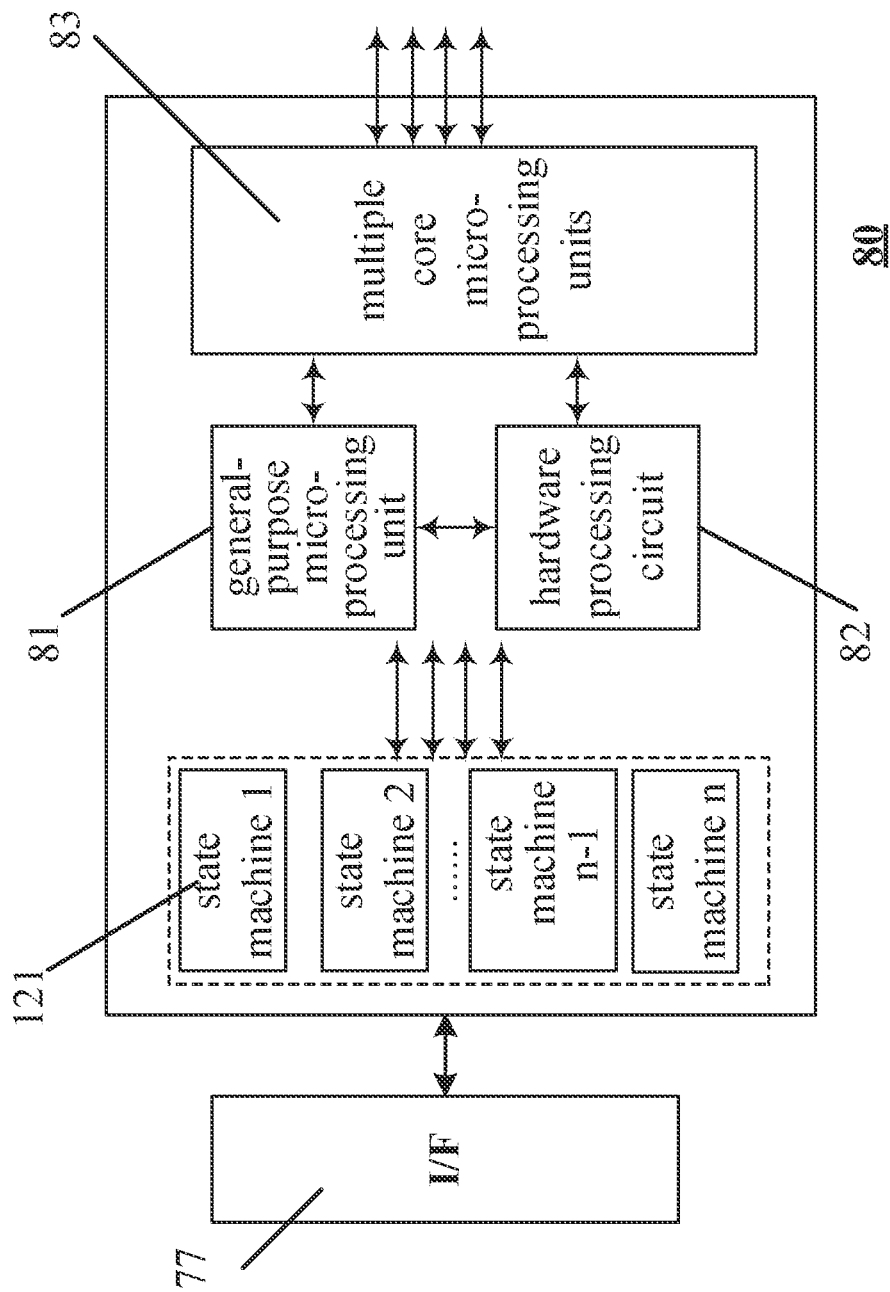
FIG. 1F is a schematic structural diagram of a control logic circuit in the peripheral circuit of a memory device according to an implementation of the present disclosure.

In the implementations of the present disclosure, the control logic circuit included in the peripheral circuit can be used for receiving a control command sent by the external host device, processing the control command correspondingly to obtain a signal needed for executing the control command, and sending the signal to the row decoder/the word line driver, the column decoder/the bit line driver, the page buffer/the sense amplifier, etc. Finally, the operation corresponding to the control command is realized. As shown in FIG. 1F, a control logic circuit 80 in the peripheral circuit 120 of the implementation of the present disclosure may include a general-purpose micro-processing unit (MP MCU) 81, a hardware processing circuit 82, and a plurality of core micro-processing units (core MCU) 83 and the like. The control logic circuit 80 may communicate with an external host (e.g., the host 20 in FIG. 1A) through the interface 77. Exemplarily, the above-described control logic circuit 80 may be the same as the control logic circuit 75 in FIG. 1E. In other implementations, the control logic circuit 80 may further include other circuit configurations and connection interfaces not shown in FIGS. 1E and 1F. In the implementation of the present disclosure, N state machines 121 may also be provided in the control logic circuit 80 of the Peripheral Circuit 120 for realizing the asynchronous processing of received control command.

FIG. 2A is a structural block diagram of a memory device according to an implementation of the present disclosure. The memory device 100 includes a memory array 110 and a peripheral circuit 120.

The memory array 110 includes a plurality of memory planes 111, each including memory blocks comprising memory cells.

The peripheral circuit 120 is connected to the memory array 110 and configured to control the plurality of memory planes 111 to perform asynchronous operations.

Herein, the peripheral circuit 120 includes at least one state machine 121.

Each of the at least one state machine 121 is disposed to correspond to at least one of the plurality of memory planes 111. The at least one state machine 121 is connected to a memory interface I/F and is capable of receiving control commands associated with asynchronous operations for the corresponding memory planes 111 in parallel from the memory interface I/F. Each of the at least one state machine 121 is capable of independently processing the received control command to obtain control information for the corresponding memory plane 111.

In the implementations of the present disclosure, the memory device 100 may be a volatile memory or a non-volatile memory, including read-only memory, random access memory, and the like. The memory device 100 may be the memory device 34 in FIGS. 1A-1C described above or the memory device 60 in FIG. 1D. The memory device in the implementations of the present disclosure may independently perform memory operations, including reading, programming, and erasing multiple memory planes, etc. Hereinafter, the description is given by taking a flash memory (NAND) as an example.

One or more NAND dies may be included in the memory device 100 and packaged in a flash memory chip with the peripheral circuit 120. Each NAND die may include an array comprising memory cells, each memory cell may store data through stored charges. During the read operation, a control gate voltage may be applied to a word line where a selected memory cell is located, and then a conduction state of the corresponding memory cell is sensed by a sensing circuit, so as to realize the reading of data. The write operation can adjust an on-voltage of the memory cell by storing charges in a floating gate of the memory cell, thereby realizing the storage of different data.

In the memory device 100, each memory cell may be arranged as a plurality of memory blocks. The memory block may be a smallest unit that may be erased at the same time. In addition, the memory cells may further be arranged as a plurality of memory planes 111, each of which includes a plurality of memory blocks and associated row/column control circuitry. Each memory plane 111 may include a two-dimensional (2D) or three-dimensional (3D) memory structure.

In the implementations of the present disclosure, the peripheral circuit 120 of the memory device 100 may at least include a plurality of state machines 121 and an additional logic circuit 122 connected to the state machines. Here, the additional logic circuit 122 is part of or all of the logic circuits other than the state machines 121 in the peripheral circuit 120. For example, the additional logic circuit 122 may include a micro-processing unit, a hardware processing circuit, or the like. The additional logic circuit 122 is connected to the memory planes 111 in the memory device 100, and is configured to control the memory planes 111 to perform asynchronous operations based on the control commands processed by the state machines. Here, the peripheral circuit 120 of the memory device 100 may be part or all of the peripheral circuit 70 in FIG. 1E described above. Exemplarily, the peripheral circuit 120 may include at least the control logic circuit 75 in the peripheral circuit 70 in FIG. 1E described above or the control logic circuit 80 in FIG. 1F. In the implementation of the present disclosure, the memory interface I/F functions to transfer control commands provided by an externally connected host (such as the host 20 shown in FIG. 1A) to the state machines 121 for processing. The memory interface I/F may be a part or all of the interface 77 in FIG. 1E or 1F, or may be a separate interface different from the interface 77, which is not limited herein.

The additional logic circuit 122 may be connected to each memory plane 111 through a corresponding interface to perform read, write, or erase operations on each memory block in the memory plane 111, such as controlling a plurality of memory planes to perform asynchronous operations such as an AMPI operation, an asynchronous programming operation, an asynchronous erase operation, etc. The additional logic circuit 122 is configured to provide various voltage or current signals in addition to clock signals for performing different asynchronous operations and providing functions such as sensing. To support a fast read operation, the additional logic circuit 122 may further be configured to support an Async Multi-plane Independent (AMPI) read operation, which is an enhanced read operation that can support simultaneous independent asynchronous read operations of different memory planes 111. In addition, the additional logic circuit 122 may be configured to support an asynchronous multi-plane programming operation, an asynchronous multi-plane erase operation, a combination of various other asynchronous operations, and the like.

Taking the AMPI read operation as an example, the commands processed by the additional logic circuit 122 are also generally asynchronous operations, and the asynchronous control commands for the memory planes 111 are queued and processed sequentially. It results in a long processing time, and the sequential processing after receiving the control commands results in that the memory plane 111 corresponding to the control command which is later processed has a too long waiting time, thereby making the overall processing time of the memory device 100 long.

Therefore, the implementation of the present disclosure uses a plurality of state machines 121 corresponding to the memory planes 111 to process the control commands. Here, the number of the plurality of state machines 121 may be equal to the number of memory planes 111, and each state machine 121 can correspond to one of the memory planes 111 on a one-to-one basis. In another implementation, the number of multiple state machines 121 may also be less than the number of memory planes 111, and one state machine 121 may correspond to one or more memory planes 111. Here, the correspondence between the state machines 121 and the memory planes 111 means that a state machine 121 is used to process control commands for one or more designated memory planes 111. If one state machine 121 corresponds to only one memory plane 111, the state machine 121 is only used for processing control commands for the corresponding memory plane 111. Exemplarily, in implementations of the present disclosure, the memory planes of the memory device may include 4, 6, 8, or more memory planes.

In the implementation of the present disclosure, each of the state machines 121 is connected to the memory interface I/F and may receive a control command for a corresponding memory plane 111. The state machine 121 parses the control command through a hardware circuit or configures parameters required for executing operations corresponding to the control command or the like.

Here, the memory interface I/F may be connected to an external host device (such as the host 20 shown in FIG. 1A), and may include bus interfaces of some control signal lines, clock signal lines, data signal lines, and the like. The host device can control the memory device 100 by sending a control command. As illustrated in FIG. 1A, the host 20 perform command interaction with the memory system 30 through a communication interface, and the controller 32 in the memory system 30 may transfer the control command sent by the host 20 to the memory device 34 (i.e., the memory device 100 shown in FIG. 2A in the above-described implementation) and to the additional logic circuit 122 through the memory interface I/F described in the above-described implementation. The control command may carry some address information such as a control command indicating the memory plane 111 to which the control command is directed. Based on address information, the corresponding state machine 121 may receive a control command and may feedback a response message or the like. After the state machine 121 processes the control command, the additional logic circuit 122 supplies a corresponding signal to control the memory plane 111.

Since the plurality of state machines 121 are hardware structures independently arranged, the control commands can be processed in parallel. If a plurality of control commands for different memory planes 111 are received at the same time or during a same time period, the plurality of state machines 121 may perform processing in parallel and transfer the control commands to the additional logic circuit 122. Then the additional logic circuit 122 performs control sequentially. The purpose of this is to divide the original control command queue into a plurality of small queues for parallel processing through the plurality of state machines 121, and the control commands in each queue can be queued separately, thereby improving the overall queuing efficiency. In the implementation of the present disclosure, the more the number of memory planes 111, the more significant the effect of shortening the overall processing time by performing asynchronous processing by the state machines 121.

Further, in the implementations of the present disclosure, the plurality of state machines 121 may be connected to a memory interface I/F separately, as shown in FIG. 2A. The memory interface I/F may include a plurality of connections, each connection is connected to a respective one of the state machines 121, and each connection may transfer a different control command to a state machine 121 to which it is connected.

Figure 2B:
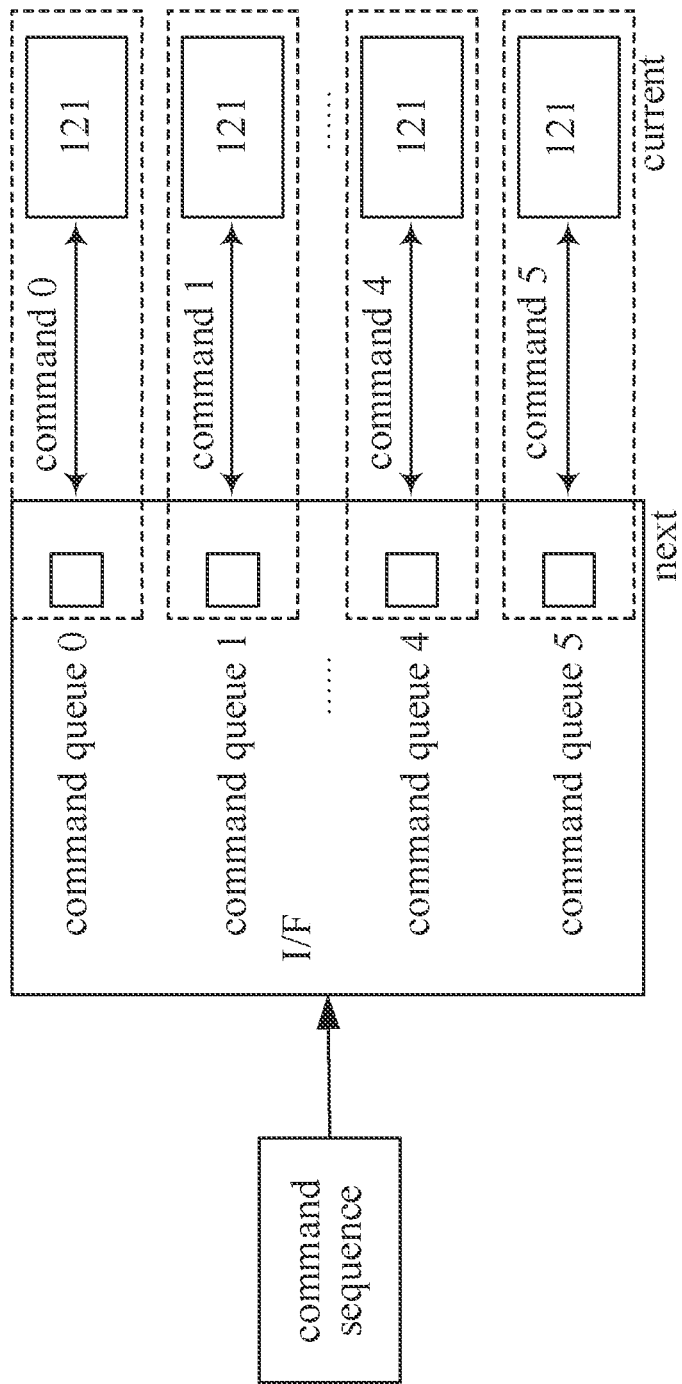
FIG. 2B is a schematic diagram of a principle of performing queue separation at a memory interface and state machines in a memory device according to an implementation of the present disclosure.

FIG. 2B illustrates the principle of the memory interface I/F separating and sending the command queue to the state machines 121. In some implementations, the plurality of state machines 121 are connected to the memory interface I/F, and the memory interface I/F may divide the received control command queue into a plurality of queues according to the number of state machines 121, and sequentially transfer the queues to the state machines 121 according to the queue order. In FIG. 2B, a current state of each state machine 121 is processing a control command, then in a next state, the state machine 121 receives and processes a next control command that the memory interface I/F waits for in the corresponding queue.

Through the above scheme, the control commands can be divided into multiple ways and processed by different state machines in the form of multiple queues, thus realizing way-level-based processing. In contrast, in some other implementations, there is a general-purpose microprocessor (MP MCU) that performs chip-level serial processing on all control commands, i.e., performing serial processing directly by the control logic of the memory chip through a single queue.

It can be understood that, compared with the mode of performing serial processing on all control commands at a chip level through a general purpose microprocessor, the way-level-based processing of control commands in the implementation of the present disclosure can effectively reduce the processing time for the control commands and the waiting time or idle time of each memory plane, thereby improving the overall operation rate of the memory.

In some implementations, the peripheral circuit 120 is configured to control the plurality of memory planes 111 to perform asynchronous operations based on control information from the plurality of state machines 121. In the implementation of the present disclosure, a plurality of state machines 121 process control commands related to the asynchronous operation of each memory plane 111, and the peripheral circuit 120 can control each memory plane 111 to perform the asynchronous operation according to these obtained control information.

Here, the processing of control information by the peripheral circuit 120 may be serial processing. For example, the additional logic circuits 122 in the peripheral circuit 120 receive the control information provided by the plurality of state machines 121, process the control information in a certain order, and send the control information to different memory planes 111 to realize control of different memory planes 111. Exemplarily, the processing of the control information by the peripheral circuit 120 may include sending signals such as voltage, current, and the like required by the asynchronous operation to each memory plane 111 according to the control information, to realize the asynchronous operation of each memory plane 111.

In the implementations of the present disclosure, the peripheral circuit 120 performs hardware processing based on the control information, so as to execute asynchronous operations corresponding to control commands.

In some implementations, each of the state machines 121 is further configured to configure a parameter according to the control command.

Herein, at least two of the plurality of state machines 121 have at least a partially overlapping time period occupied by processing the control commands and performing the parameter configuration.

In the implementation of the present disclosure, the state machine 121 may also be used for parameter configuration and corresponding parameter configuration may be performed based on different control commands. Since the plurality of state machines 121 can be processed in parallel, the time for parsing control commands and parameter configuration of the plurality of state machines 121 can overlap each other, that is, different state machines 121 can simultaneously perform respective parsing and configuration procedures.

In this way, time differences between the different memory planes 111 starting to perform operations can be reduced, thereby reducing the processing duration of the memory device 100 as a whole.

Figure 3:
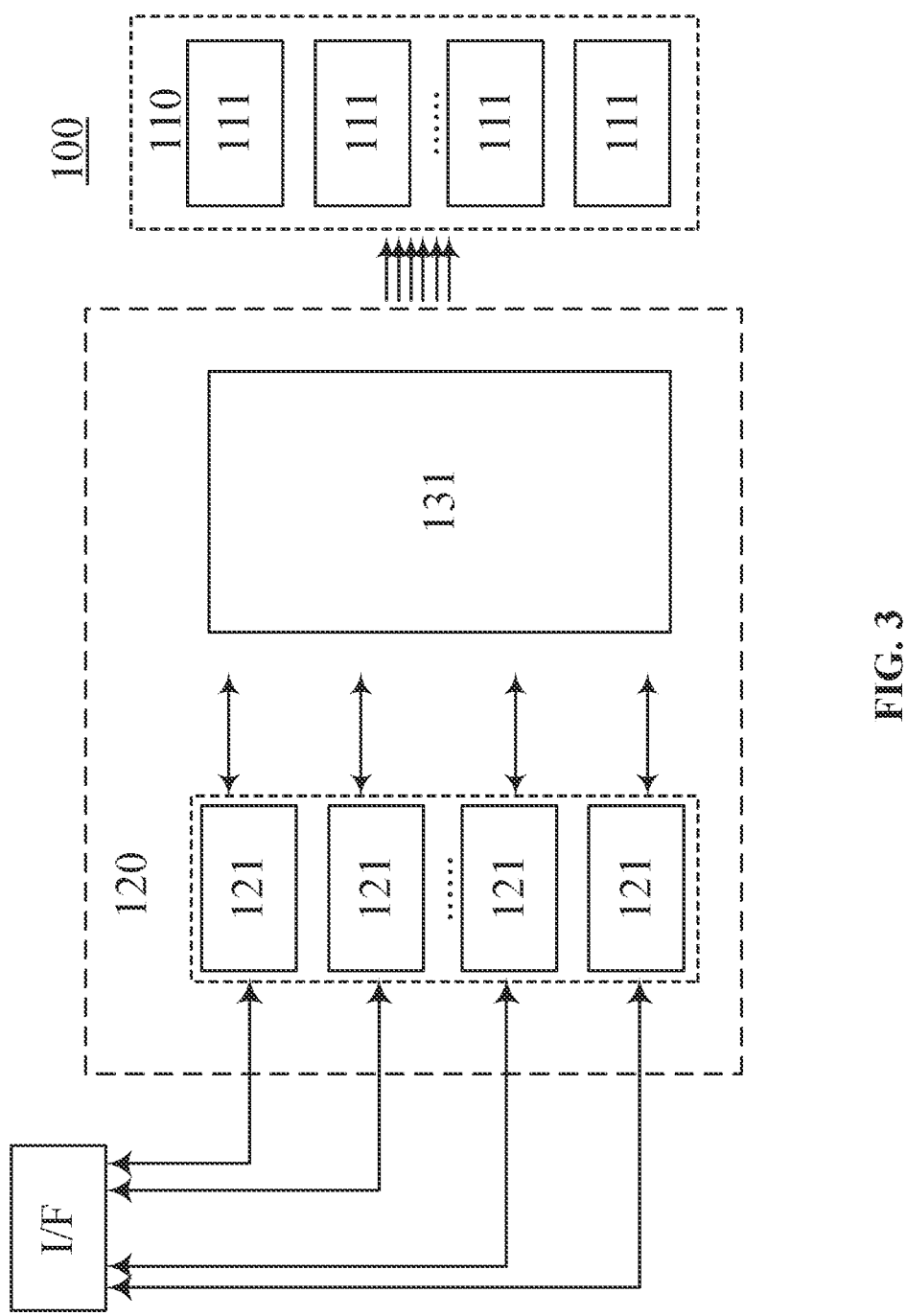
FIG. 3 is a schematic structural diagram of a memory device according to an implementation of the present disclosure.

In some implementations, as shown in FIG. 3, the peripheral circuit 120 further includes a sequence calculation circuit 131.

The sequence calculation circuit 131 is connected to the plurality of state machines 121 and configured to determine a processing order of the control information according to the control information of the plurality of state machines 121.

Since the peripheral circuit 120 still needs to serially process the control information corresponding to the control commands, in the implementation of the present disclosure, a sequence calculation circuit 131 is added to sequence the control information obtained after being processed by the state machine 121, to determine the processing order of the control information.

That is to say, after a plurality of state machines 121 perform shunt queuing and related processing on control commands, the sequence calculation circuit 131 is used for queuing the control information.

After determining the processing order of the control information, the sequence calculation circuit 131 sequentially instructs the peripheral circuit 120 to execute corresponding control commands based on the control information, thereby facilitating the rational utilization of control resources in the peripheral circuit 120 and reducing resource conflicts.

In some implementations, each of the state machines 121 is configured to send a processing request to the sequence calculation circuit 131 according to the control commands.

In some implementations, the sequence calculation circuit 131 is configured to determine an order of processing the control information by the peripheral circuit 120, according to the processing requests sent by the plurality of state machines 121.

In the implementation of the present disclosure, each of the state machines 122 may send a processing request to the sequence calculation circuit 131 according to the control command, and the processing request is to request the sequence calculation circuit 131 to perform sequencing processing.

The processing request may include memory plane information corresponding to the control command to be processed, such as memory plane number, address, and other information, and may also include information such as some operation types. The sequence calculation circuit 131 sequences the received control information through these information, and the peripheral circuit 120 can process the control information according to the sequence, and then execute the asynchronous operation on each memory plane.

Figure 4:
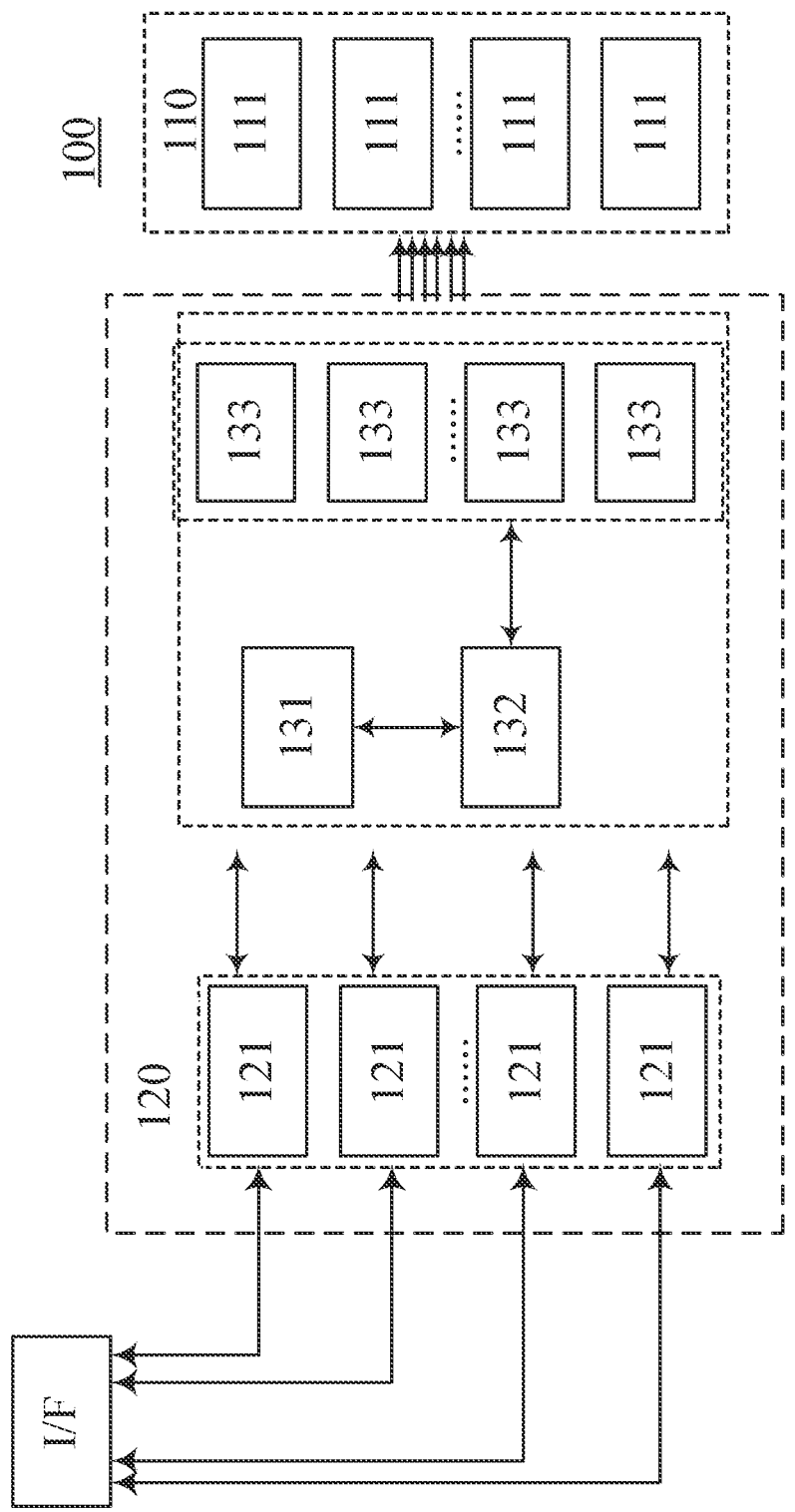
FIG. 4 is a schematic structural diagram of a memory device according to an implementation of the present disclosure.

In some implementations, as shown in FIG. 4, the peripheral circuit 120 further includes hardware calculation circuit 132 and a plurality of micro-processing units 133.

The hardware calculation circuit 132 is connected to the sequence calculation circuit 131 and configured to sequentially determine control parameters corresponding to the control information according to the processing order.

The plurality of micro-processing units 133 correspond to the plurality of memory planes 111 respectively, are connected to the hardware calculation circuit 133 and to the corresponding memory planes 111 respectively, and the plurality of micro-processing units 133 are configured to perform the asynchronous operations on the memory planes 111 according to the control parameters.

In the implementation of the present disclosure, the hardware calculation circuit 132 in the peripheral circuit 120 is used to determine various signals required for the asynchronous operations of the memory planes 111 according to the control information, including voltage, current and corresponding timing changes required for various operations. The hardware calculation circuit 132 performs serial processing, so the hardware calculation circuit 132 can perform corresponding processing according to the processing order provided by the sequence calculation circuit 131.

In addition, the hardware calculation circuit 132 needs to provide control parameters to micro-processor units (Core MCUs) 133. The micro-processing units 133 are connected to the memory planes 111 respectively, and each micro-processing unit 133 can independently control a respective one of the memory planes 111. In some implementations, one micro-processing unit 133 may also control a plurality of memory planes 111.

The hardware calculation circuit 132 transfers the control parameters to a corresponding micro-processing unit 133 and then the micro-processing unit 133 controls a corresponding memory plane 111. The micro-processing units 133 may be connected to the memory planes 111 through a control bus, which may include various logic circuit connections to the memory plane 111, including word lines, bit lines, selection lines, control lines, and the like connected to each memory cell.

In some implementations, each of the plurality of state machines 121 is further connected to a corresponding micro-processing unit 133 and configured to provide an enable signal to the micro-processing unit 133 upon receipt of a control command.

In implementations of the present disclosure, the operating state of each micro-processing unit 133 and the operating state of the corresponding state machine 121 can be synchronized by communication therebetween. Thus, when the state machine 121 receives a new control command, the micro-processing unit 133 can be enabled by an enable signal, so that the micro-processing unit 133 can make corresponding preparations for the control operation to be performed, and at the same time, the clock synchronization and the like can be achieved.

In some implementations, the state machines 121 may correspond to the micro-processing units 133 one to one, thereby communicating individually with each micro-processing unit 133 and enabling the corresponding micro-processing unit 133. In other implementations, one state machine 121 may also correspond to multiple micro-processing units 133, and communicate with and enable the multiple micro-processing units 133.

In some implementations, each of the plurality of micro-processing units 133 is further configured to send state information to a corresponding state machine 121 after the control operation of the memory plane 111 based on one of the control commands is completed.

Each of the state machines 121 is further configured to receive a next control command after receiving the state information sent by the corresponding micro-processing unit 133.

In addition, the communication connection between each micro-processing unit 133 and each state machine 121 can be used for the micro-processing unit 133 to inform the state machine 121 of its own processing state. If the micro-processing unit 133 is in an operating state, it may provide a type of state information, and the state machine suspends processing of a next control command or temporarily stop receiving the next control command. If the micro-processing unit 133 is in an idle state, it may provide another type of state information, and the state machine 121 may receive the next control command and enable the micro-processing unit 133 to perform a next round of operation.

Exemplarily, the micro-processing unit 133 may output a signal to the state machine 121. If the signal is in a high-level state, it represents that the micro-processing unit 133 is currently in an operating state. If the signal is in a low-level state, it represents that the micro-processing unit 133 is currently in an idle state.

In this way, resource conflicts can be further reduced, processing efficiency can be improved, and the possibility of operation errors caused by resource conflicts can be reduced.

Figure 5:
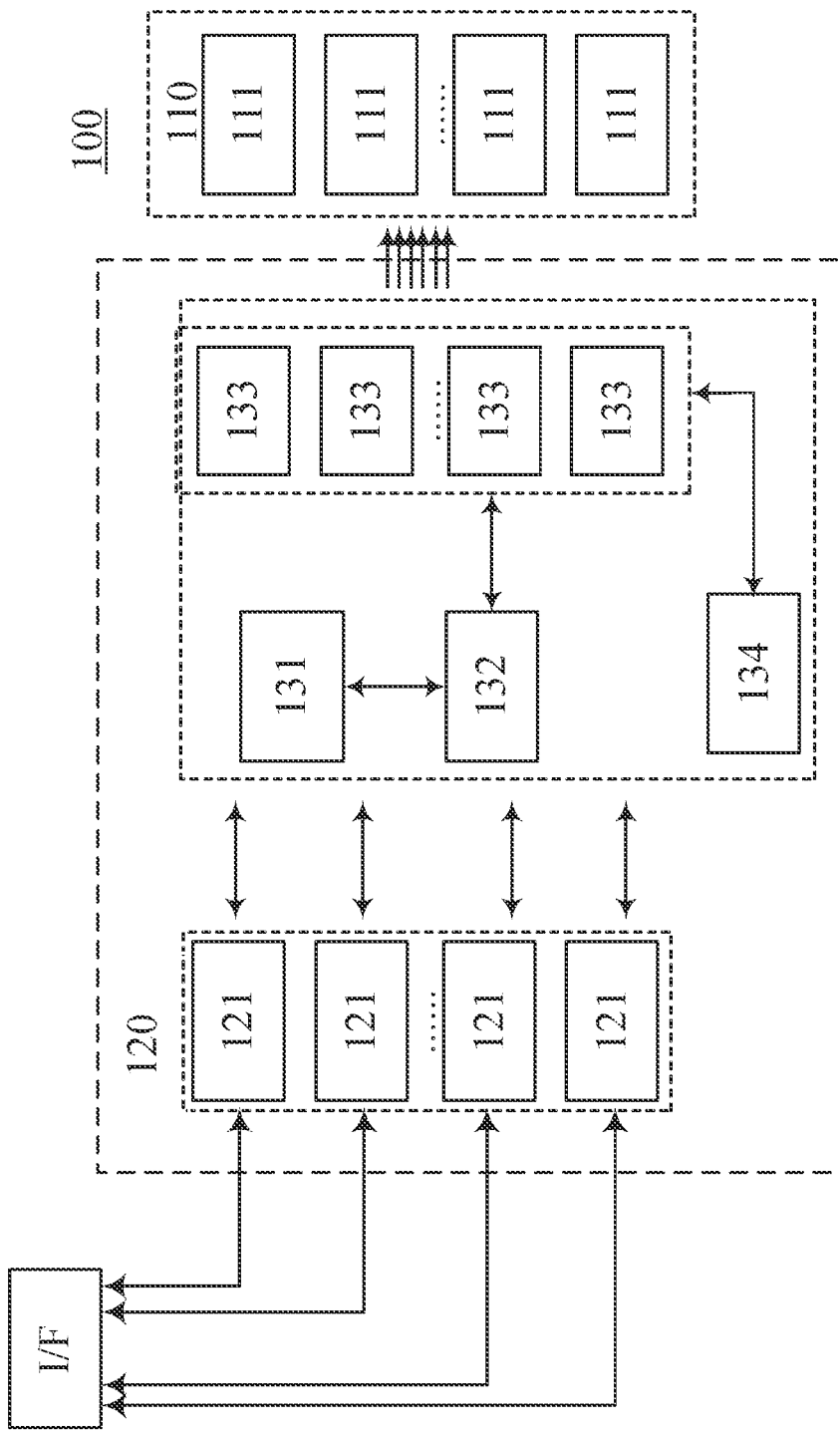
FIG. 5 is a schematic structural diagram of a memory device according to an implementation of the present disclosure.

In some implementations, as shown in FIG. 5, the peripheral circuit 120 further includes a main processor 134.

The main processor 134 is connected to the memory interface I/F and the plurality of micro-processing units 133 and configured to receive state information sent by the plurality of micro-processing units 133 and send total state information determined from the plurality of state information to the memory interface I/F. Herein, the total state information is used to indicate that the plurality of micro-processing units 133 have ended control operations based on a set of control commands.

The main processor 134 is connected to the memory interface I/F and can directly receive some external control commands. By way of example, the main processor 134 may be implemented by a general-purpose microprocessor. Further, the main processor 134 is connected to a plurality of micro-processing units 133 and can perform control of each memory plane 111 in the memory device 100 by software. Thus, the memory planes 111 can be flexibly controlled by using the main processor 134 in conjunction with the state machines 121. The main processor 134 can be used to implement some functions during some function expansion or debugging, or can be used when serial processing of various control commands is needed.

In the implementation of the present disclosure, each of the micro-processing units 133 may send respective state information to the main processor 134. If all the micro-processing units 133 are already in an idle state, the main processor 134 may send total state information to the memory interface I/F to indicate that the memory device 100 is in an idle state. In this way, it is convenient for the external host to perform some other total control on the memory device 100 or to perform operations, such as reset, refresh, and the like, on the memory device 100.

The total state information may include state information provided by each micro-processing unit 133, or may be information indicating that the memory device is in an idle state generated according to the state information provided by each micro-processing unit 133.

In some implementations, the main processor is further configured to receive a reset command. The reset command is used to reset the operation of each memory plane 111 in the memory device 100.

In the implementations of the present disclosure, to reset the memory device 100, a reset command may be sent to the main processor 134 through the memory device 100 interface. The main processor 134 may perform a reset operation on each memory plane 111 upon receiving the reset command.

It should be noted that, the reset operation may be performed at any time, for example, when a memory plane 111 is in an idle state, the reset operation may be performed on the memory plane 111. For another example, when a memory plane 111 is performing a read-write operation, if a reset command is received, the current read-write operation may be stopped and the reset operation may be performed. Here, the reset operation may include releasing the charges at each node, zeroing or normalizing the signal on each signal line, and the like.

In some implementations, the plurality of state machines 121 are further connected to the plurality of memory planes 111, respectively, and are configured to send address information to the corresponding memory planes 111 according to the control commands.

In the implementations of the present disclosure, the plurality of state machines 121 may further be connected to a plurality of memory planes 111 respectively, for example via an address bus. The state machines 121 may send address information including row address information and column address information to be operated, information of memory blocks to be operated, or the like to the memory planes 111 through the address bus. If the state machines 121 correspond to the memory planes 111 one-to-one, the address information sent by each of the state machines may include only the address information of the corresponding memory cell in the memory plane 111 and need not include the address information of the memory plane.

Figure 6:
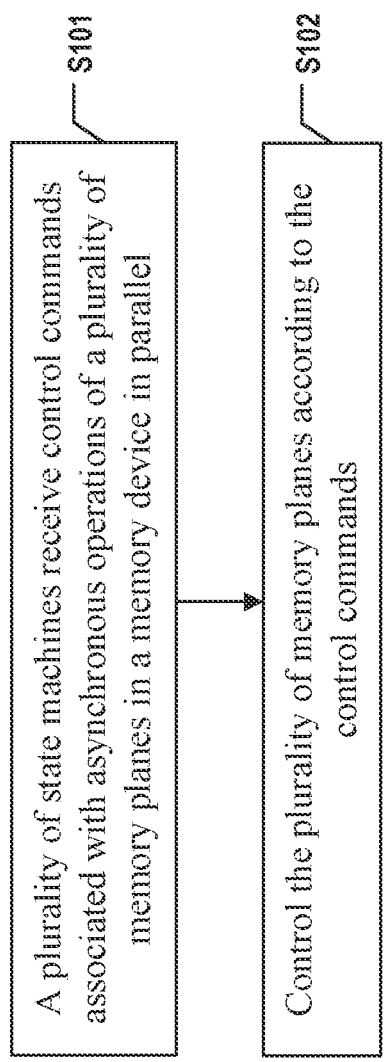
FIG. 6 is a flowchart of a method for controlling a memory device according to an implementation of the present disclosure.

As shown in FIG. 6, the implementation of the present disclosure further provides a method for controlling a memory device, which is executed by a peripheral circuit in the memory device. The peripheral circuit includes at least one state machine. The method comprises the following operations.

In step S101, the state machines in the memory receive the control commands related to the asynchronous operation of memory planes in the memory device in parallel. Herein, each of the state machines is disposed to be corresponding to at least one of the plurality of memory planes.

In step S102, each of the state machines independently processes the received control command(s) to obtain the control information of the corresponding memory plane.

In the implementation of the present disclosure, at least one state machine is included in the memory device, and different state machines may correspond to different memory planes. Exemplarily, one state machine may correspond to one memory plane or to multiple memory planes. A plurality of state machines may be connected to the memory interface and receive control commands sent from the memory interface for the asynchronous operation of the memory planes. The plurality of state machines may receive and process control commands in parallel. Compared with the method of serially processing control commands related to asynchronous operations, the present method can reduce the waiting time of related circuits and improve the utilization of processing resources, thereby improving processing efficiency and reducing processing delay.

In some implementations, the method further includes that, the peripheral circuit controls the plurality of memory planes to perform the asynchronous operation based on the control information.

After receiving the control commands, the state machines can parse the control commands and obtain corresponding control information. The process of parsing control commands by multiple state machines can also be performed in parallel, so that the parsing of control commands for multiple different memory planes can be completed synchronously.

After parsing the control commands, the plurality of state machines can send the control information obtained by the parsing to an additional logic circuit of the peripheral circuit respectively. Then asynchronous operations on the memory planes are performed.

In some implementations, the method further includes that, the state machines configure parameters according to the control commands. Herein, at least two of the state machines have at least a partially overlapping time period occupied by processing the control commands and performing the parameter configuration.

In some implementations of the present disclosure, the plurality of state machines can further perform parameter configuration according to the control commands. Since the plurality of state machines can perform processing in parallel, the time for the plurality of state machines to parse the control commands and the time for the plurality of state machines to perform the parameter configuration may overlap each other, that is, different state machines can simultaneously perform respective parsing and configuration processes.

Compared with the mode in which control commands related to asynchronous operations are parsed serially through a general-purpose processor, and the peripheral circuit waits for each control command and then performs control operation sequentially, the method in the implementation of the present disclosure can reduce time differences between different memory planes starting to execute operations, thereby reducing the overall processing time of the memory device.

In some implementations, the peripheral circuit controls the plurality of memory planes to perform asynchronous operations based on the control information, including: determining a processing order in which the control information is processed by the peripheral circuit according to the control information provided by the plurality of state machines; sequentially processing the control information according to the processing order; and controlling the plurality of memory planes to perform the asynchronous operations according to the processed control information In the implementation of the present disclosure, after the state machines perform parsing processing and parameter configuration on the control commands, the peripheral circuit can perform corresponding control operations on the memory planes. Since the additional logic circuits in the peripheral circuit can perform serial operations, the control commands of the plurality of state machines can be sequenced and then sequentially executed by these logic circuits. The peripheral circuit can process the corresponding control information according to the processing order of each control command, and then control the corresponding memory planes sequentially for the asynchronous operations.

In some implementations, the operation of determining a processing order of the control information based on the control information provided by the plurality of state machines includes the following actions.

A sequence calculation circuit in the peripheral circuit receives processing requests sent by the plurality of state machines based on the control commands.

The sequence calculation circuit determines the processing order of the control information based on the processing requests.

In the implementation of the present disclosure, the sequencing action may be performed by the sequence calculation circuit in the controller. The plurality of state machines may send the processing requests to the sequence calculation circuit according to the received and parsed control commands. The sequence calculation circuit may sequence the control information corresponding to the control commands according to the processing requests, and process the control information according to the sequence, so as to execute asynchronous operations on different control memory planes.

In some implementations, the operation of sequentially processing the control information in the processing order includes that, the hardware calculation circuit in the peripheral circuit sequentially determines the control parameters corresponding to the control information in the processing order according to the control information provided by the state machines.

In the implementations of the present disclosure, the processing order determined by the sequence calculation circuit may be provided to the hardware calculation circuit. The hardware calculation circuit is used to calculate control parameters, such as the required voltage, current, and corresponding timing, according to specific control commands. The hardware calculation circuit performs serial processing, so the hardware calculation circuit can perform corresponding processing according to the processing order provided by the sequence calculation circuit.

In some implementations, the operation of controlling the plurality of memory planes to perform asynchronous operations according to the processed control information includes that, a plurality of micro-processing units in the peripheral circuit control the corresponding memory planes to perform asynchronous operations according to the control parameters. Herein, the plurality of micro-processing units correspond to the plurality of memory planes respectively.

The hardware calculation circuit may provide control parameters to the micro-processing units. The micro-processing units are connected with the memory planes respectively, and each micro-processing unit can independently control one memory plane. The plurality of micro-processing units are used for performing asynchronous operations for the plurality of memory planes.

In other implementations, one micro-processing unit may control multiple memory planes.

The hardware calculation circuit transfers the control parameters to the corresponding micro-processing units, and then the micro-processing units control the corresponding memory planes. The micro-processing units may be connected to the memory planes through a control bus, which may include various logic circuits connected to the memory planes, including word lines, bit lines, selection lines, control lines, and the like connected to each memory cell.

In this way, the micro-processing units can execute corresponding operations on the memory planes according to the control parameters provided by the hardware calculation circuit, and then achieve results of executing the control commands.

In some implementations, the method further includes that, the plurality of state machines provide enable signals to the micro-processing units upon receiving the control commands.

In the implementations of the present disclosure, the operating state of each micro-processing unit and the operating state of each state machine can be synchronized by communication therebetween. Thus, when receiving a new control command, the state machine can enable the micro-processing unit by an enable signal, so that the micro-processing unit can make corresponding preparations for the upcoming control operation, and meanwhile, it can also achieve the functions of clock synchronization and the like.

In the implementation of the present disclosure, the state machine can send an enable signal to the corresponding micro-processing unit after receiving the control command, to enable the micro-processing unit to enter a waiting state. The enable signal may also be sent to the corresponding micro-processing unit after the operation such as parsing the control command is completed, so that the micro-processing unit starts to receive information such as the corresponding control parameters and execute the operation on the memory plane.

In some implementations, the method further includes the following operations.

A micro-processing unit sends state information to a corresponding state machine, after finishing the control operation of the control plane based on one piece of the control information; and the state machine receives a next control command after receiving the state information sent by the corresponding micro-processing unit.

In the implementation of the present disclosure, a micro-processing unit can be connected to a corresponding state machine, and the micro-processing unit enters an idle state after completing a control operation of one control command, and at this time, can send state information to the state machine. In this way, the state machine can continue to accept the next control command and continue the corresponding parsing processing.

In some implementations, the method further includes that, a main processor in the peripheral circuit receives the state information sent by the plurality of micro-processing units and sends total state information to the memory interface. Herein, the total state information is used to indicate that the plurality of micro-processing units have finished the control operation based on a set of control commands.

The plurality of micro-processing units can send their own state information to the main processor respectively, and the main processor can perform overall management. When the state information of the plurality of micro-processing units indicates that they are in an idle state, it indicates that the memory device as a whole is in the idle state, and at this time, the total state information can be sent to the memory interface.

Thus, it is convenient for the host to which the memory device is connected to determine the state of the memory device and perform other control operations.

In some implementations, the method further includes that, the main processor receives a reset command, and reset the operation of each memory plane in the memory device according to the reset command.

The main processor may receive a reset command from the memory device interface and perform a reset operation on each memory plane. The reset operation can be performed at any time. For example, the reset operation can be performed on each memory plane when the memory plane is in an idle state. If a reset command is received when a read operation or a write operation is being performed on the memory plane, the current read operation or write operation can be stopped and the reset operation can be performed. Here, the reset operation may include releasing charges at each node, zeroing or normalizing the signal on each signal line, and the like.

In some implementations, the method further includes that, the plurality of state machines send address information to the corresponding memory planes respectively according to the control commands.

In the implementation of the present disclosure, the plurality of state machines may further directly send address information to the memory planes, the address information is used to indicate the specific addresses of the memory cells to be operated by the control commands, thereby facilitating the controller to perform corresponding operations on the memory planes.

Implementations of the present disclosure also provide the following example.

Figure 7:
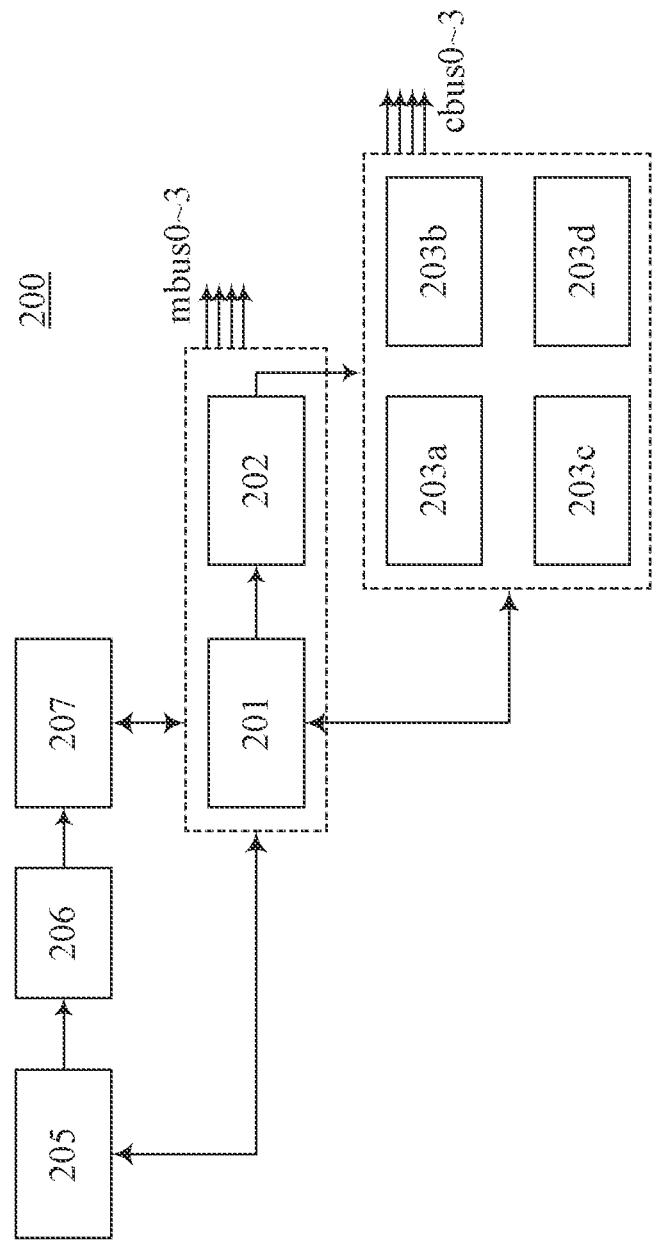
FIG. 7 is a schematic structural diagram of a memory device according to an implementation of the present disclosure.

In an implementation, the memory device 200 as shown in FIG. 7 includes a general purpose controller (MP MCU) 201, a hardware processing circuit (HW Calc) 202, and core micro-processing units 203a, 203b, 203c, and 203d corresponding to a plurality of memory planes. The micro-processing units 203 are connected to the memory planes through a data bus (cbus0~3). Further, a memory interface (nand if) 205 is connected to a synchronization circuit (sync) 206. In addition, the hardware processing circuit 202 and the universal controller 201 can be connected to the memory planes through an address bus (mbus0~3) to provide address information.

Control commands (cmds), after entering through a memory interface 205, can be clock-synchronized by a synchronization circuit 206 and transferred to a command sequence processing circuit (cmd_seq) 207. The command sequence processing circuit 207 sequentially transfers the control commands to a universal controller 201 through serial processing. The required control parameters are obtained by calculation of the hardware processing circuit 202, and the universal controller 201 may enable the micro-processor units 203. Then the micro-processing unit 203 can perform control operations on the respective memory planes.

However, since the general-purpose controller performs command parsing through software, it can only perform serial processing. In order to avoid resource conflict between the general-purpose controller and the hardware processing circuit 202, multiple ways of control commands need to wait for each other. This method has low utilization, and can only perform the read operation or write operation at one time, and cannot simultaneously perform read and/or write operations of multiple memory planes. In addition, since the line width of the bus is 8 bits, the degree of parallelism is low.

Figure 8:
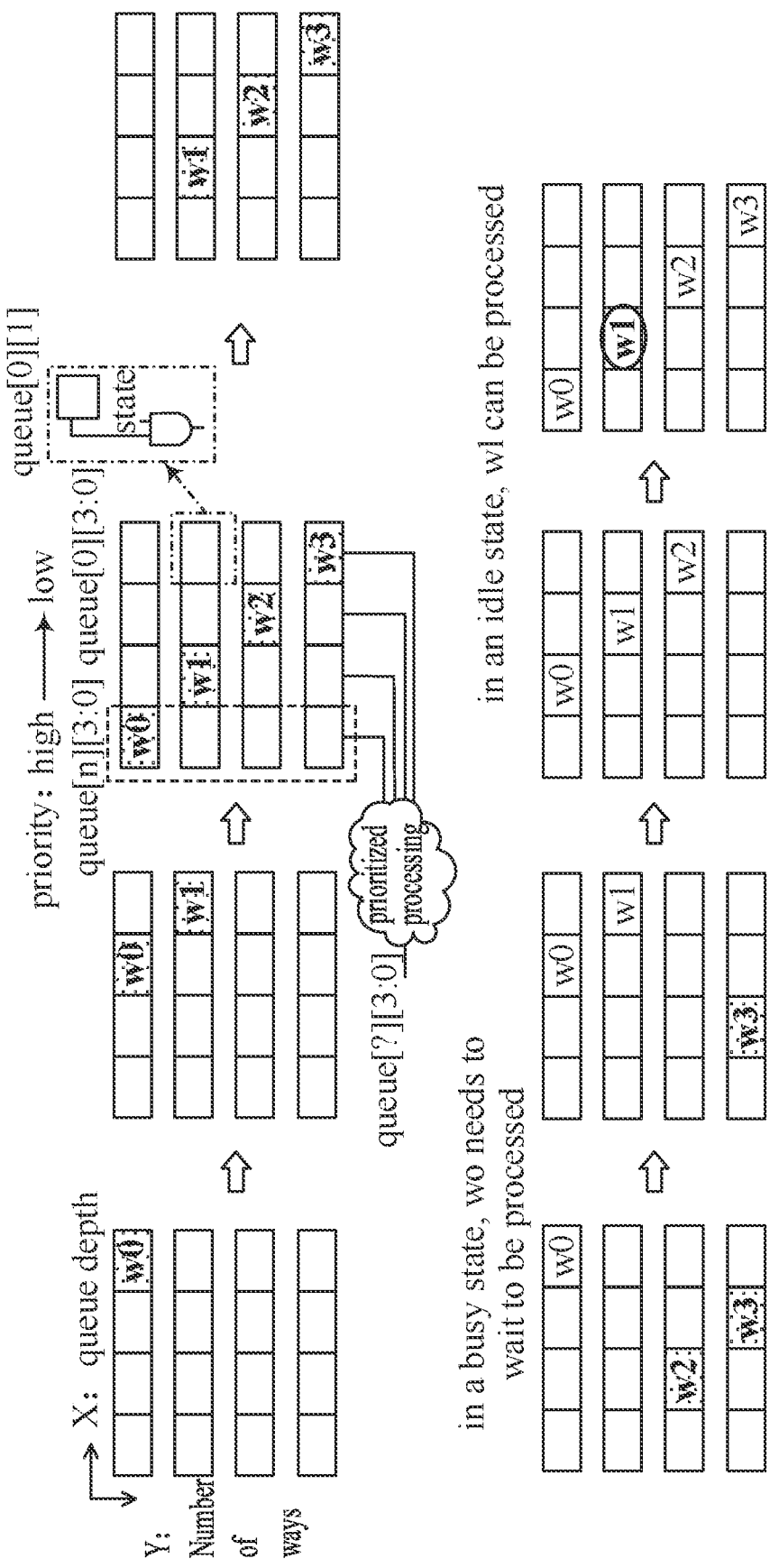
FIG. 8 is a principal diagram of a method for controlling a memory device in an implementation.

As shown in FIG. 8, the Y direction denotes multi-way control commands for different memory planes, and the X direction denotes a queue depth of control commands for each memory plane. After each control command (W0~W3) enters in turn, it needs to be serially processed in a mutual time-sharing manner. Only when the micro-processing unit corresponding to one control command is in an idle state, can it be operated. For a busy micro-processing unit, the corresponding control commands need to be in a waiting state. Each queue is processed according to an order of priority from high to low. When it is the turn to process a control command at a queue position, logical operation processing, such as "AND operation" processing, can be performed through the state value of the micro-processing unit corresponding to the queue. As an example, when it is the turn to process the control command at a position [0] [1] of a queue, if there is a control command to be processed with a state value of "1" (idle state) at the position, it can be processed; and if the state value is "0" (busy state), it is waiting for processing.

Figure 9:
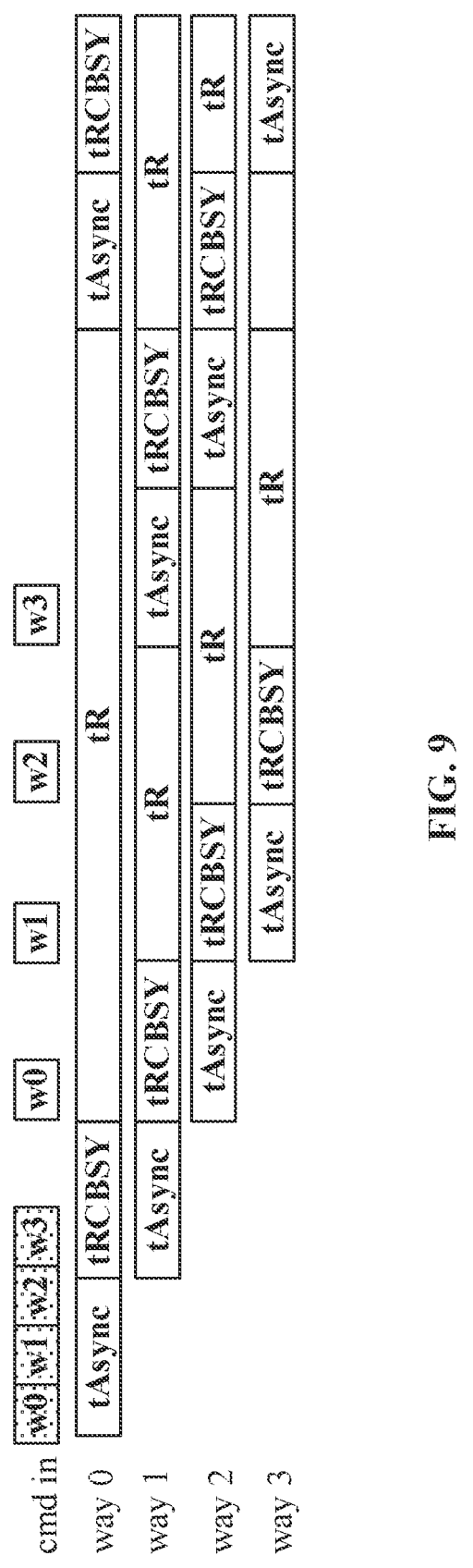

As shown in FIG. 9, after the control commands (W0-W3) enter, four ways of control commands (Way0-Way3) of the general-purpose controller are processed respectively, and the processing time interval between control commands of each two different memory planes is tAsync, and correspondingly, the processing time of each way is tAsync. For a subsequent command, the general-purpose controller needs to wait for tRCBSY before continuing to receive a next control command.

Figure 10:
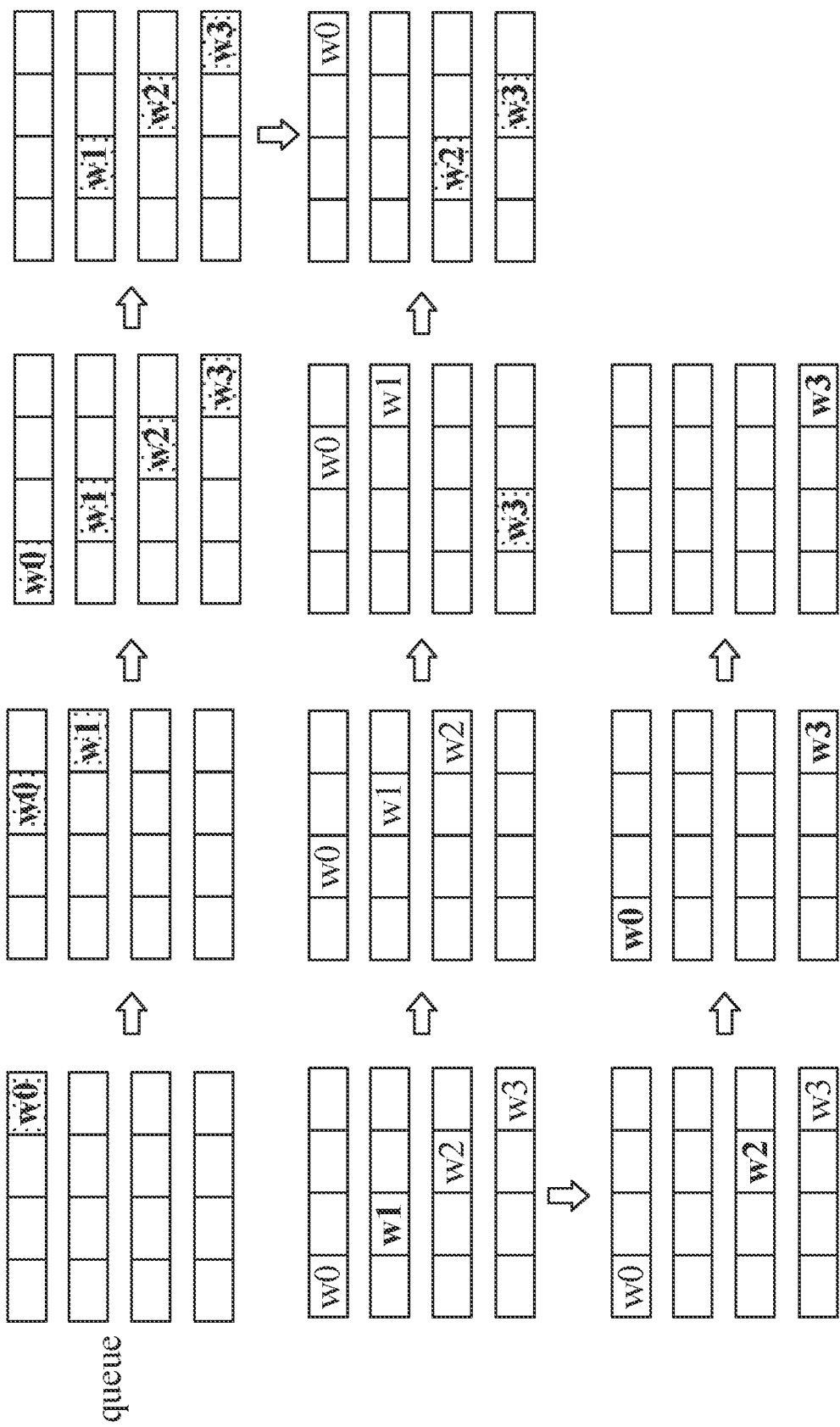
FIG. 10 is a schematic diagram of a method for controlling a memory device in an implementation.

For different control commands, the corresponding read durations tR may also be different. Only after the reading operation time duration corresponding to the first group of control commands, can the waiting next control command be processed. In this way, the later control commands need to wait longer, which leads to a low overall operation efficiency. The processing order and state of each control command are shown in FIG. 10.

The above example is a read operation for a 4-way AMPI. If the read operation is performed with a 6-way AMPI, the delay will be larger and the command processing queue will be more complex.

Figure 11:
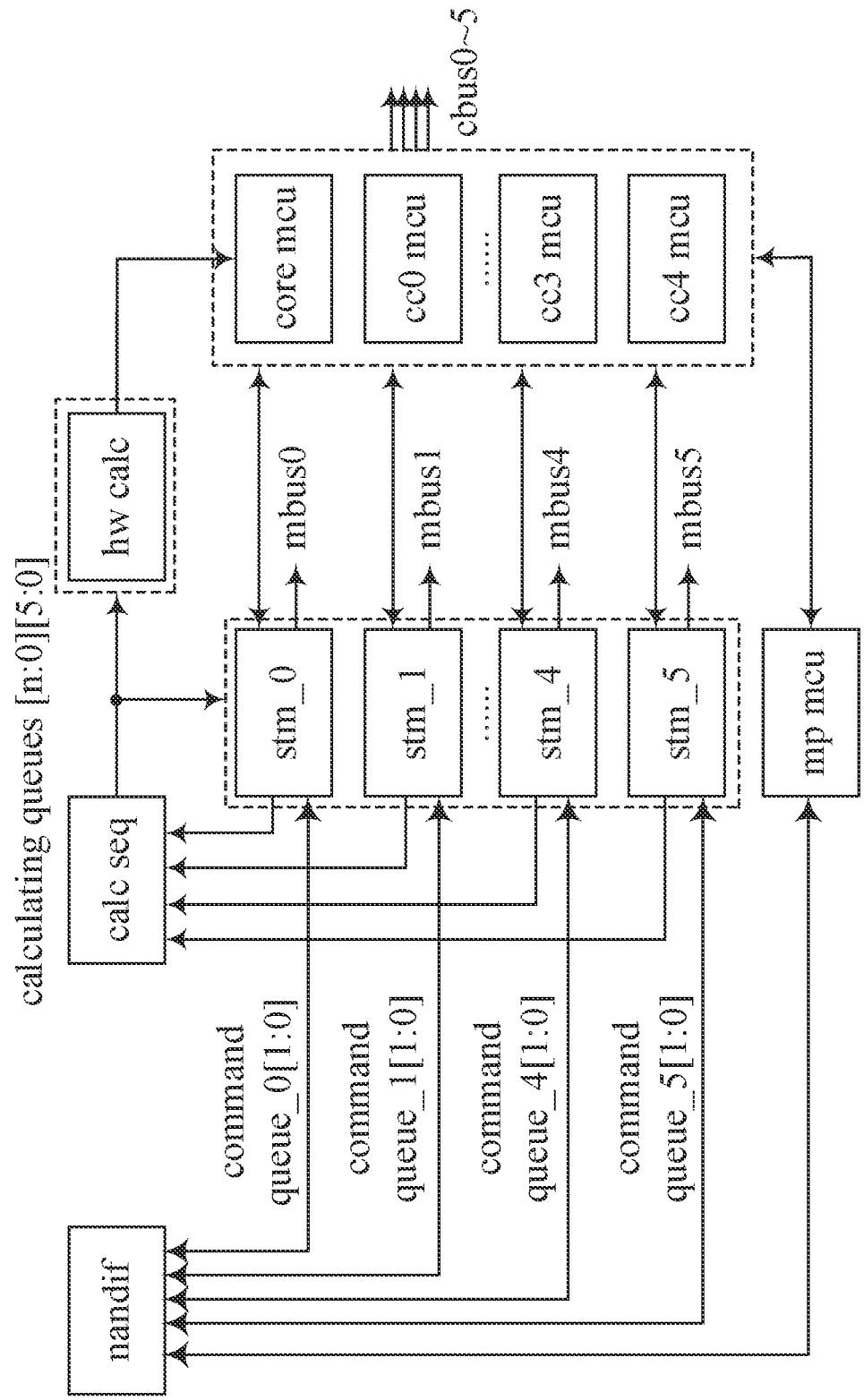
FIG. 11 is a schematic structural diagram of a memory device according to an implementation of the present disclosure.

Therefore, the implementation of the present disclosure provides a method and a memory structure for parallel processing control commands. As shown in FIG. 11, the 6-way AMPI read operation can be parsed in parallel by different state machines (STM0-STM5). By controlling one of the plurality of micro-processing units (core mcu0-5), waveform information, such as waveform information of the read operation, defined by electrical design rules for a corresponding memory plane can be generated. In addition, the configuration of parameters is realized by a sequence calculation unit and a hardware processing unit. In this way, the control commands for different memory planes are processed in parallel through a plurality of separate queues, so that the one-dimensional serial processing mode is changed into a two-dimensional parallel processing mode. Therefore, the processing efficiency can be effectively improved and resource conflicts can be reduced.

Figure 12:
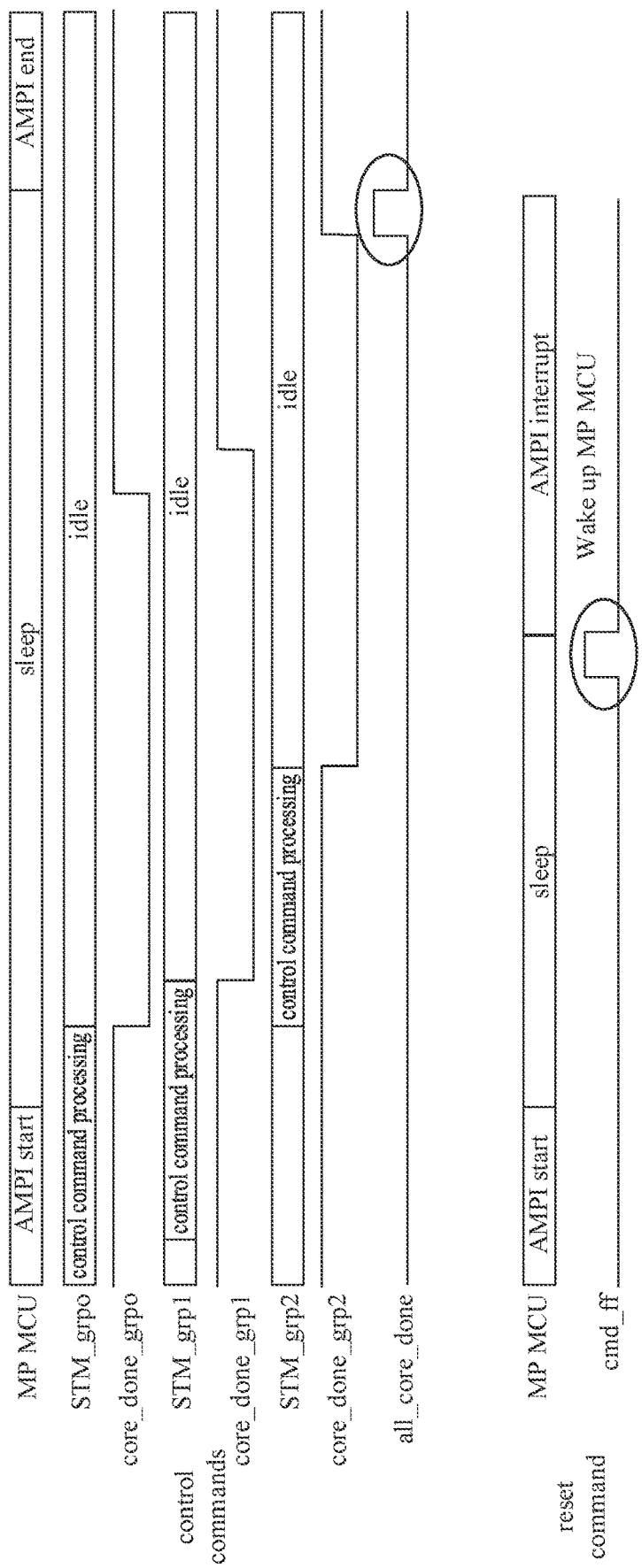
FIG. 12 is a signal timing diagram in a method for controlling a memory device according to an implementation of the present disclosure.

FIG. 12 shows the processing timings of the state machines and the state timings of the corresponding micro-processing units (core_done_grp). The processing periods of the state machines may include overlapping periods, in which different control commands are processed in parallel. The processing periods of the state machines include overlapping periods, so that the time differences tAsync in processing the control commands between different ways is shorter than those in the case where the processing periods do not overlap each other.

The state of the main controller (MP MCU) can be triggered to enter into the AMPI operation state when a control command is received. Then, due to the processing of the control command by the state machines, the main controller can go to a sleep state. After a plurality of micro-processing units complete the operation, the corresponding state information can be sent to the general-purpose controller, and the rising edge of the waveform, such as core_done_grp0~2 shown in FIG. 12, indicates that the corresponding micro-processing units complete the operation. At this time, the main controller MP MCU can be waked up and send out total state information indicating that all the micro-processing units have completed operation, such as the rising edge of the waveform of all_core_done shown in FIG. 12. At this time, the main controller MP MCU can end the current AMPI operation state.

In addition, the main controller can also be used to perform a reset operation. The main controller is waked up after receiving a reset command (cmd_ff), and controls the memory device to interrupt an ongoing AMPI read operation, for example, terminates the operation of parallel processing the memory planes.

Figure 13:
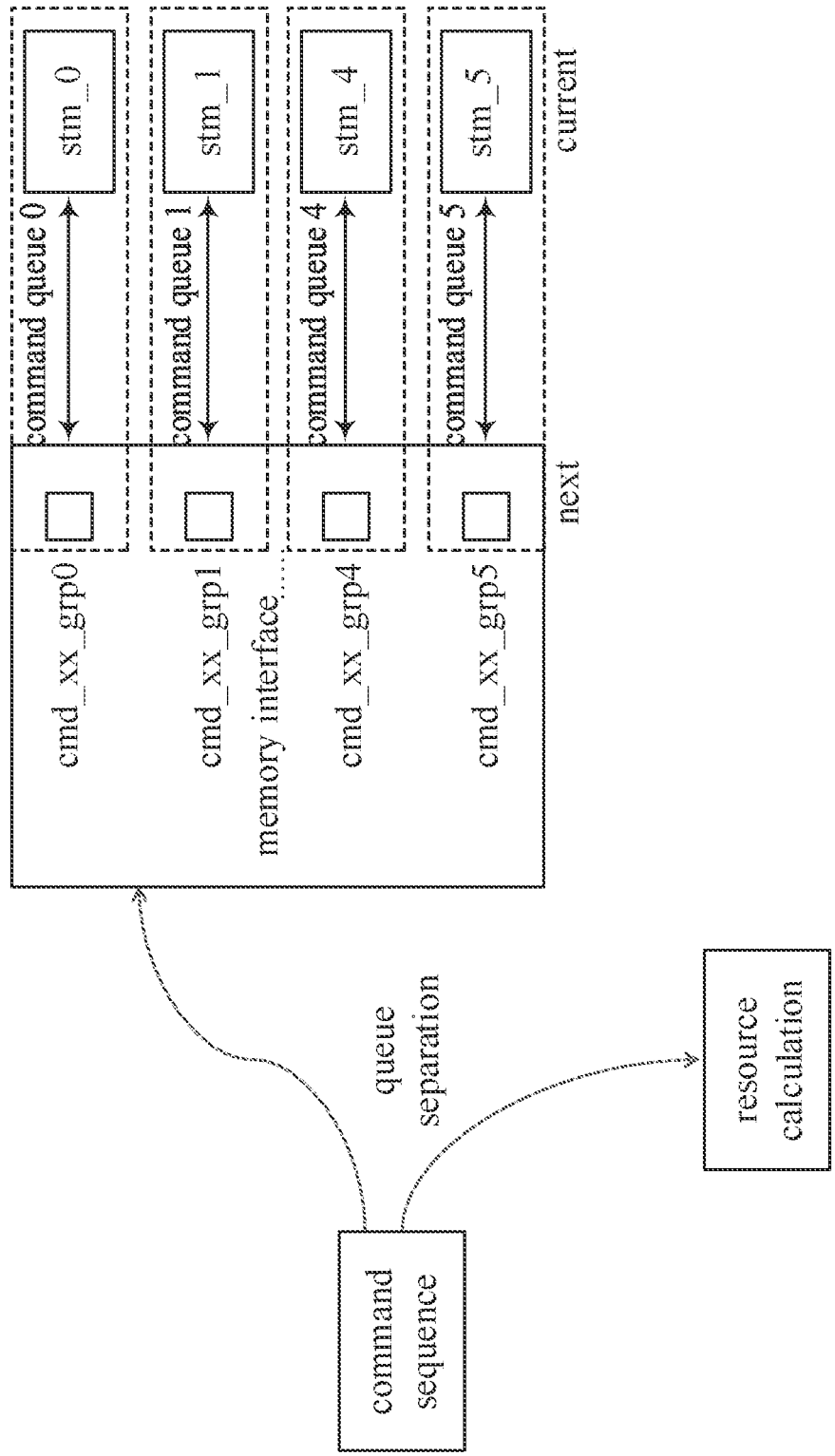
FIG. 13 is a schematic diagram of a method for controlling a memory device according to an implementation of the present disclosure.

In the implementation of the present disclosure, command queues and resource allocation are processed respectively, and thus state machines implement parallel processing of a plurality of command queues, thereby reducing the processing time of the way-level commands. A sequence calculation circuit is used to queue the resources, and resource conflicts that may be generated by the hardware processing circuit are handled at the chip level. Since there is no need to wait for parsing of the control commands, the conflict time is short and the queue depth is reduced, thus improving the processing efficiency as a whole, as shown in FIG. 13. Exemplarily, on one hand, the command sequence may perform chip-level resource calculation and on the other hand, the command sequence may be divided into multiple queues at the memory interface and then provided to corresponding state machines respectively after way-level processing. As shown in FIG. 13, the command sequence after chip-level resource calculation can be divided and enter into different queues of the memory interface, for example, a total of 6 queues cmd_xx_grp0~5. Here, cmd_xx refers to different command types, such as read command cmd_rd, write command cmd_wr, etc. A plurality of queues at the memory interface are connected to different state machines (such as stm0~5 shown in FIG. 13) respectively, and each of the control commands is sent to the state machines in an order of the queue.

Figure 14:
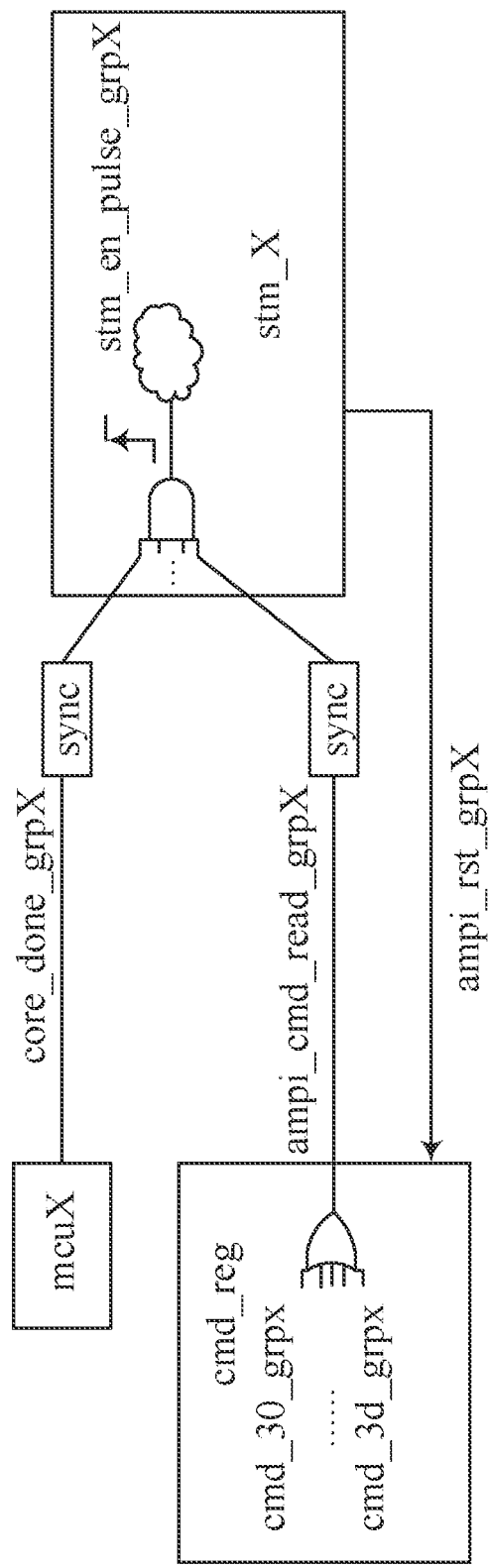
FIG. 14 is a diagram of a way-level processing principle of a control command queue in a method for controlling a memory device according to an implementation of the present disclosure.
Figure 15:
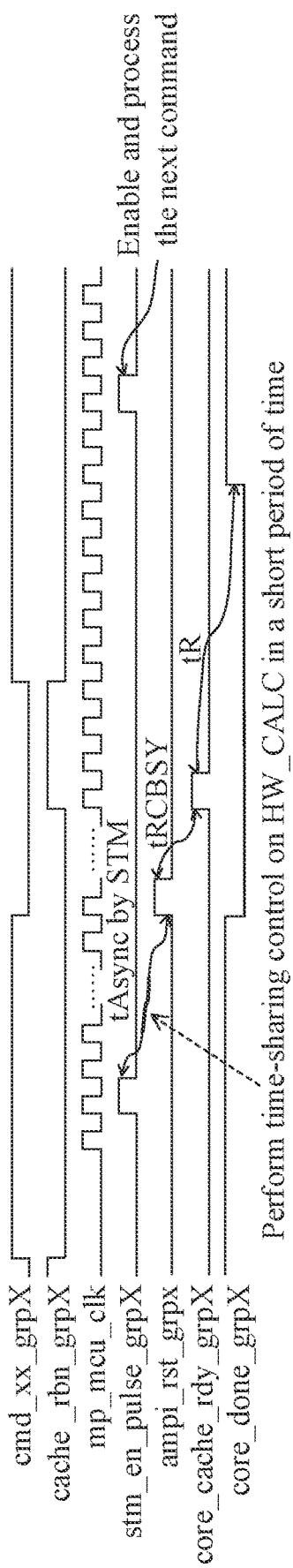
FIG. 15 is a timing diagram of the signals based on FIG. 14.

FIG. 14 is a diagram of a way-level processing principle for controlling command queues, and FIG. 15 is a diagram of timings of signals corresponding to FIG. 14. As shown in FIG. 14, a next set of command sequences to be processed is determined from a queue of multiple control commands (cmd_30_grpX . . . cmd_3d_grpX) through state selection. For example, a command sequence (ampi_cmd_read_grpX) for which an ampi read operation is to be performed is determined as a sequence to be processed for asynchronous processing (sync) and sequentially transferred to the corresponding state machine stm_x. As shown in FIG. 15, during a period after the state machine is enabled (stm_en_pulse_g-rpX signal) and before the ampi processing reset signal (ampi_rst_grpX signal) sent by the state machine, the state machine and the controller perform calculation processing on the control command, and the processing time difference tAsync between the state machines is included in this period. The period after the ampi processing is reset and before the memory device is ready (core_cache_rdy_grpX signal) is the waiting time tRCBSY required before the instruction is executed. When the memory device is ready, the operation of the control command, such as read operation, can be performed and the corresponding duration is tR. In addition, the signal cotr_done_grpX indicates that all the micro-processing units (mcuXs) are in an available state, i.e. the operation of the previous control command has been completed. The mp_mcu_clk in FIG. 15 is a clock signal of the main processor. Each of the above signals can be triggered by a rising or falling edge of the clock signal. The signal cache_rbn_grpX is used as a trigger signal for transferring a control command.

Figure 16:
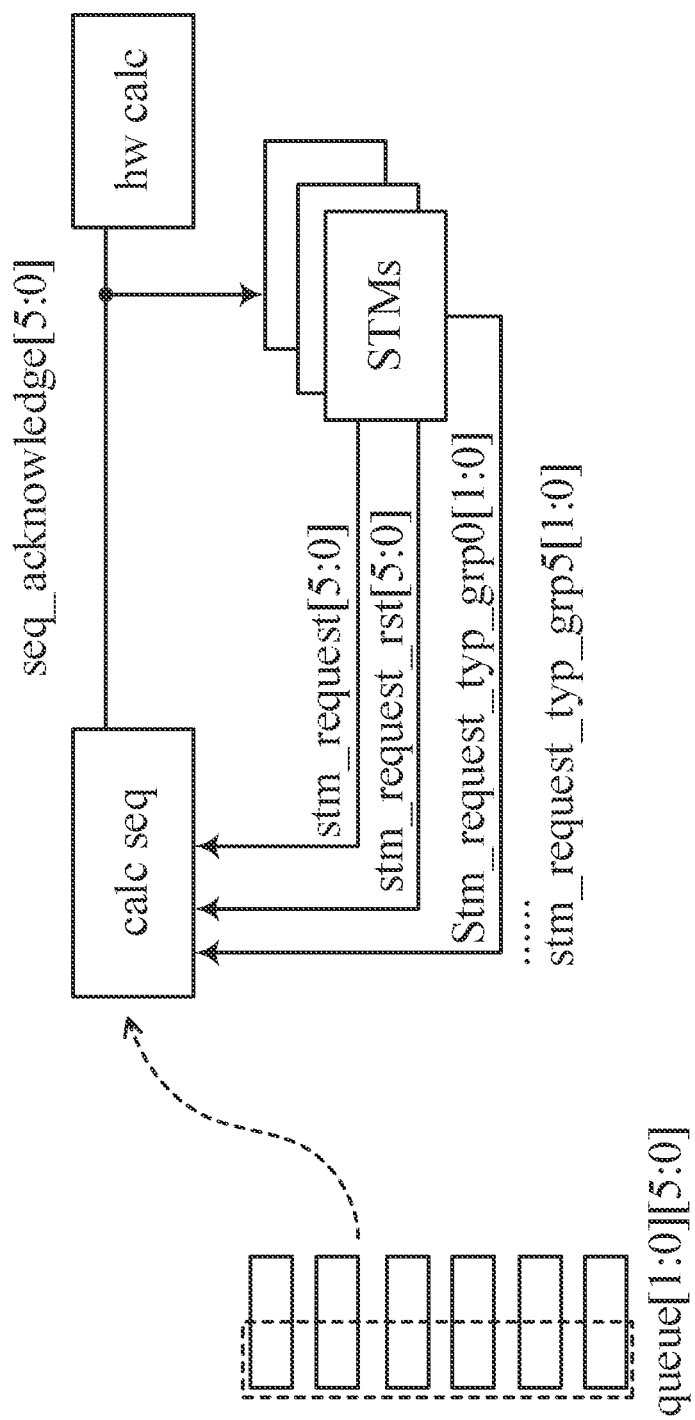
FIG. 16 is a diagram of a principle of information interaction between a plurality of state machines, a sequence calculation circuit, and a hardware calculation circuit in a method for controlling a memory device according to an implementation of the present disclosure.
Figure 17:
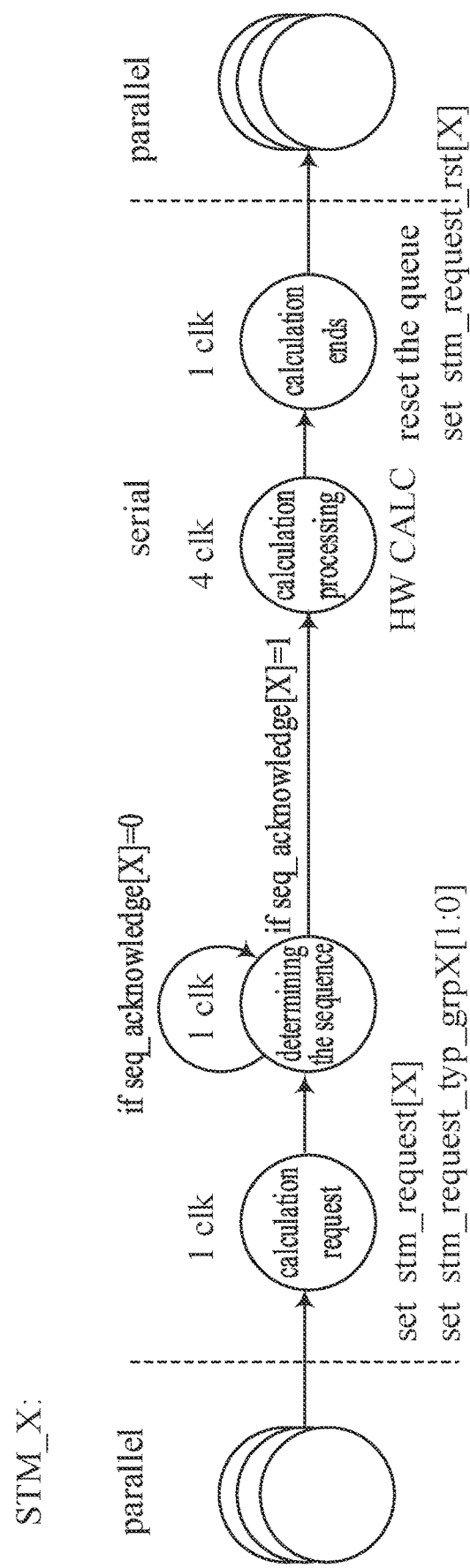
FIG. 17 is a schematic diagram of time periods required for various processing processes shown based on FIG. 16.

FIG. 16 shows an information interaction process between a plurality of state machines (STMs), a sequence calculation circuit (calc seq), and a hardware calculation circuit (hw calc). FIG. 17 shows a time period required for the processing process. As shown in FIGS. 16 and 17, the state machines STMs process the received control commands in parallel, and send the processing requests (stm_request [x]) and types (stm_request_typ_grpX [1:0]) of the processing requests of the state machines to the operation processing circuit within one clock cycle (lclk) of a calculation request stage. Next, the calculation processing circuit performs calculation within a clock cycle (lclk) based on a sequence of the queue (queue [1:0] [5:0]) in FIG. 16, to confirm control information to be processed next. If it is determined to process current control information (seq_unknown [x]=1), the related control information is transferred to the hardware calculation circuit (hw calc) for calculation processing. If it needs to wait for the current control information to be processed (seq_knowledge [x]=0), the judgment is made after waiting for one clock cycle (lclk). The processing performed by the hardware processing circuit (hw calc) may require multiple clock cycles, such as 4clk serial processing. After that, the state machines is reset (set_stm_request_rst [x]) and continues parallel processing of the next control command.

Figure 18:
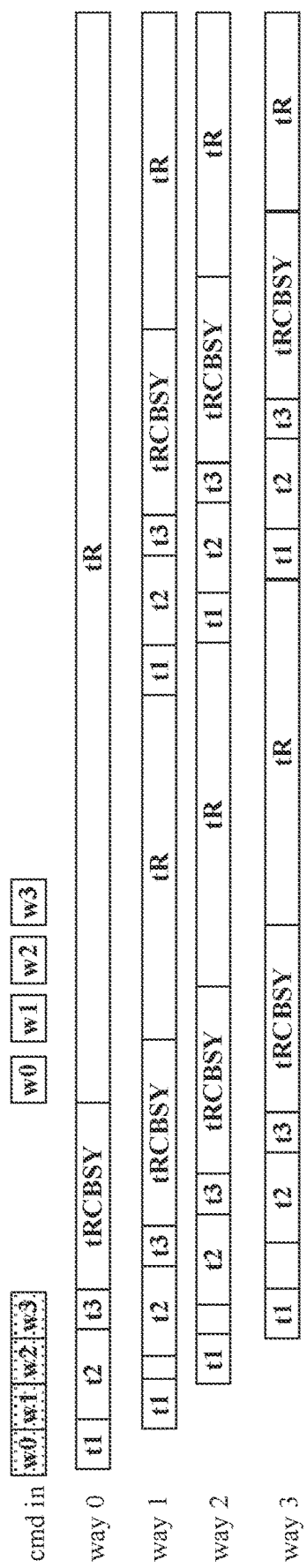
FIG. 18 is a timing diagram of a method for controlling a memory device according to an implementation of the present disclosure.

FIG. 18 is a state diagram of controlling various memory planes in the implementation of the present disclosure. As shown in FIG. 18, after the control commands (W0 to W3) for the memory planes enter, the different state machines receive the control commands in turn and process the control commands accordingly. t1 to t3 in FIG. 18 represent different setting processes covering periods required to read the setting. As can be seen in FIG. 18, the time differences tAsync in processing the control commands between different ways is only a part of the entire time duration required to read the setting. Therefore, the processing time duration is shortened as a whole compared to the case shown in FIG. 9.

It should be understood that references to "an implementation" or "the implementation" throughout the specification mean that features, structures, or characteristics related to the implementations are included in at least one implementation of the present disclosure. Thus, the words "in an implementation" or "in the implementation" appearing throughout the specification do not necessarily refer to the same implementation. Further, these features, structures, or characteristics may be incorporated in any suitable manner in one or more implementations. It should be understood that in various implementations of the present disclosure, the size of the serial number of the above-described processes does not mean the order of execution, and the execution order of each process should be determined by its function and inherent logic, and should not constitute any limitation on the implementation process of the implementations of the present disclosure. The above serial numbers of the implementations of the present disclosure are for description only and do not represent the advantages and disadvantages of the implementations.

It should be noted that, in this article, the terms "including" or any other variation thereof are intended to encompass non-exclusive inclusion, so that a process, method, article, or device that includes a set of elements includes not only those elements but also other elements that are not explicitly listed, or also elements inherent to such a process, method, article or device. In the absence of further limitations, an element defined by the phrase "includes a/an" does not preclude the existence of another identical element in the process, method, article, or device in which it is included.

In the implementations according to the present disclosure, it should be understood that the disclosed apparatus and methods may be implemented in other ways. The above-described device implementations are only illustrative, for example, the division of the units is only a logical functional division, which can be implemented in other ways. For example, multiple units or components can be combined, or can be integrated into another system, or some features can be ignored or may not be performed. In addition, the coupling, or direct coupling, or communication connection between the various components shown or discussed may be indirect coupling or communication connection through some interfaces, devices, or units, and may be electrical, mechanical, or other forms.

The units described above as separate units may or may not be physically separated. The components shown as units may or may not be physical units. The units can be located in one place or distributed in multiple network elements. Part of or all of the units can be selected according to actual needs to achieve the purpose of the implementations.

In addition, each functional unit in each implementation of the present disclosure can be integrated into one processing unit, or each unit can be separately implemented as one unit, or two or more units can be integrated in one unit. The integrated unit can be realized either by hardware or by a combination of hardware and software functional units.

The above is only implementations of the present disclosure, and the scope of the present disclosure is not limited thereto. Any technician familiar with the technical field can easily think of changes or substitutions within the technical scope of the present disclosure, which should be covered within the scope of the present disclosure. Therefore, the scope of the present disclosure shall be subject to the scope of the claims.

What is claimed is:

1. A memory device, comprising:
a memory array comprising a plurality of memory planes; and
a peripheral circuit configured to control the plurality of memory planes to perform asynchronous operations,
wherein the peripheral circuit comprises a plurality of state machines connected to a memory interface of the memory device, each state machine being configured to:
be associated with one or more assigned memory planes of the plurality of memory planes;
receive, from the memory interface in parallel with other state machines, a corresponding sequence of control commands of the one or more assigned memory planes; and
independently process the corresponding sequence of control commands to obtain control information of the one or more assigned memory planes.

2. The memory device of claim 1, wherein:
time periods occupied by at least two of the state machines for processing corresponding control commands at least partially overlap with each other; and
the peripheral circuit is configured to control the plurality of memory planes to perform the asynchronous operations based on the control information obtained from the plurality of state machines.

3. The memory device of claim 1, wherein:
each state machine is further configured to perform parameter configuration based on one of the control commands; and
wherein time periods occupied by at least two of the state machines for performing the parameter configuration at least partially overlap with each other.

4. The memory device of claim 1, wherein the peripheral circuit further comprises:
a sequence calculation circuit configured to determine a processing order for processing the control information by the peripheral circuit based on the control information obtained from the plurality of state machines.

5. The memory device of claim 4, wherein:
the plurality of state machines are configured to send processing requests to the sequence calculation circuit based on the control commands; and
the sequence calculation circuit is configured to determine the processing order based on the processing requests.

6. The memory device of claim 4, wherein the peripheral circuit further comprises:
a hardware calculation circuit connected to the sequence calculation circuit and configured to determine, sequentially based on the processing order, control parameters based on the control information; and
a plurality of micro-processing units, each being associated with a corresponding state machine, and being connected to the hardware calculation circuit and the one or more assigned memory planes of the corresponding state machine, and configured to perform the asynchronous operations on the one or more assigned memory planes based on the control parameters.

7. The memory device of claim 6, wherein each state machine is further configured to provide an enable signal to the corresponding micro-processing unit upon receiving the corresponding sequence of control commands.

8. The memory device of claim 7, wherein
each micro-processing unit is further configured to send state information to the corresponding state machine after completing a control operation on the one or more assigned memory planed based on one control command of the corresponding sequence of control commands; and
each of the state machines is further configured to receive a next control command of the corresponding sequence of control commands after receiving the state information from the corresponding micro-processing unit.

9. The memory device of claim 6, wherein the peripheral circuit further comprises:
a main processor, connected to the memory interface and the plurality of micro-processing units, and configured to:
receive state information from the plurality of micro-processing units;
determine whether the memory device is in an idle state based on the state information from the plurality of micro-processing units; and
send total state information indicates whether the memory device is in the idle state to the memory interface.

10. A method for controlling a memory device, performed by a peripheral circuit in the memory device, the peripheral circuit comprising a plurality of state machines each associated with one or more assigned memory planes, the method comprising:
receiving, by each state machine in parallel with other state machines, a corresponding sequence of control commands of the one or more assigned memory planes from a memory interface of the memory device; and
independently processing, by each state machine, the corresponding sequence of control commands to obtain control information of the one or more assigned memory planes;
controlling, by the peripheral circuit, the memory planes to perform asynchronous operations based on the control information obtained from the plurality of state machines.

11. The method of claim 10, further comprising:
performing, by each state machine, parameter configuration based on one of the control commands, wherein time periods occupied by at least two of the state machines for performing the parameter configuration at least partially overlap with each other.

12. The method of claim 10, wherein controlling the memory planes to perform asynchronous operations comprises:
determining, by a sequence calculation circuit in the peripheral circuit, a processing order for processing the control information based on the control information obtained from the plurality of state machines.

13. The method of claim 12, wherein determining the processing order comprises:
receiving, by the sequence calculation circuit, processing requests sent from the plurality of state machines based on the control commands; and
determining, by the sequence calculation circuit, the processing order for the control information based on the processing requests.

14. The method of claim 12, wherein controlling the memory planes to perform asynchronous operations further comprises:
processing the control information sequentially based on the processing order; and
controlling the memory planes to perform the asynchronous operations based on the processed control information.

15. The method of claim 14, wherein processing the control information sequentially comprises:
determining sequentially based on the processing order, by a hardware calculation circuit in the peripheral circuit, control parameters corresponding to the control information.

16. The method of claim 15, wherein controlling the memory planes to perform the asynchronous operations comprises:
controlling, by a plurality micro-processing units in the peripheral circuit, corresponding memory planes to perform asynchronous operations based on the control parameters,
wherein each of plurality micro-processing units is associated with a corresponding state machine, and is connected to the hardware calculation circuit and the one or more assigned memory planes of the corresponding state machine.

17. The method of claim 16, wherein receiving the corresponding sequence of control commands comprising:
providing, by each state machine, an enable signal to the corresponding micro-processing unit upon receiving one control command in the corresponding sequence;
receiving, by each state machine from the corresponding micro-processing unit, state information indicating a control operation on the one or more assigned memory planed based on the one control command in the corresponding sequence is completed; and
receiving, by each state machine, a next control command in the corresponding sequence after receiving the state information from the corresponding micro-processing unit.

18. The method of claim 16, further comprising:
receiving, by a main processor in the peripheral circuit, state information from the plurality of micro-processing units;
determining, by the main processor, whether the memory device is in an idle state based on the state information from the plurality of micro-processing units; and
send, by the main processor, total state information indicates whether the memory device is in the idle state to the memory interface.

19. A memory system, comprising:
a memory device, comprising:
a memory array comprising a plurality of memory planes, and
a peripheral circuit configured to control the plurality of memory planes to perform asynchronous operations; and
a controller, connected to the memory device, and configured to send control commands to the memory device through a memory interface of the memory device;
wherein the peripheral circuit comprises a plurality of state each being configured to:
be associated with one or more assigned memory planes of the plurality of memory planes
receive, from the memory interface in parallel with other state machines, a sequence of a corresponding subset of the control commands related to the one or more assigned memory planes; and
independently process the sequence of the corresponding subset of the control commands to obtain control information of the one or more assigned memory planes.

20. The memory system of claim 19, wherein the memory system is a Solid State Drive (SSD) or a memory card.

* * * * *